(12) United States Patent
Shin et al.

(10) Patent No.: US 12,170,061 B2
(45) Date of Patent: Dec. 17, 2024

(54) DISPLAY DEVICE

(71) Applicant: Samsung Display Co., Ltd., Yongin-Si (KR)

(72) Inventors: Dong Hee Shin, Yongin-si (KR); No Kyung Park, Yongin-si (KR); Sun Kwun Son, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/952,366

(22) Filed: Sep. 26, 2022

(65) Prior Publication Data

US 2023/0206836 A1 Jun. 29, 2023

(30) Foreign Application Priority Data

Dec. 29, 2021 (KR) .................. 10-2021-0191663

(51) Int. Cl.
*G09G 3/3233* (2016.01)

(52) U.S. Cl.
CPC ... *G09G 3/3233* (2013.01); *G09G 2300/0426* (2013.01); *G09G 2300/0842* (2013.01); *G09G 2330/021* (2013.01)

(58) Field of Classification Search
CPC ......... G09G 3/3233; G09G 2300/0426; G09G 2300/043; G09G 2300/0819; G09G 2300/0842; G09G 2310/0262; G09G 2320/0295; G09G 2320/043; G09G 2330/021; H01L 25/0753; H01L 27/124; H01L 27/156; H01L 33/08; H01L 33/387; H01L 33/50; H01L 33/62; H01L 33/16
See application file for complete search history.

(56) References Cited

U.S. PATENT DOCUMENTS

| 10,084,031 B2 | 9/2018 | Park et al. |
| 2019/0229153 A1* | 7/2019 | Park .................. C09K 11/0883 |
| 2021/0057482 A1* | 2/2021 | Kong ..................... H01L 33/36 |
| 2021/0193784 A1* | 6/2021 | Hong .................. H01L 29/7869 |

(Continued)

FOREIGN PATENT DOCUMENTS

| KR | 10-2018-0036818 A | 4/2018 |
| KR | 10-2020-0034896 A | 4/2020 |
| KR | 10-2021-0008206 A | 1/2021 |

(Continued)

*Primary Examiner* — Stacy Khoo
(74) *Attorney, Agent, or Firm* — Innovation Counsel LLP

(57) ABSTRACT

A display device includes a pixel including a first sub-pixel emitting light of a first color and a second sub-pixel emitting light of a second color. Each of the first sub-pixel and the second sub-pixel includes: a pixel circuit layer disposed on a substrate, the pixel circuit layer including a pixel circuit, and a display element layer disposed on the pixel circuit layer, the display element layer including a light emitting element which includes an anode electrode and a cathode electrode. The pixel circuit layer includes a first contact part disposed between the substrate and the display element layer, the anode electrode and the pixel circuit being connected to each other through the first contact part to supply an anode signal to the light emitting element. A plurality of first contact parts which include a first contact part in the first sub-pixel and a first contact part in the second sub-pixel are arranged along a first direction.

16 Claims, 15 Drawing Sheets

(56) References Cited

U.S. PATENT DOCUMENTS

2021/0249392 A1    8/2021  Woo et al.
2023/0045968 A1*   2/2023  Wu ................... H10K 59/1213

FOREIGN PATENT DOCUMENTS

| KR | 10-2021-0039521 A | 4/2021 | | |
| KR | 10-2021-0102560 A | 8/2021 | | |
| WO | WO-2020111391 A1 * | 6/2020 | ............. | H01L 24/24 |

* cited by examiner

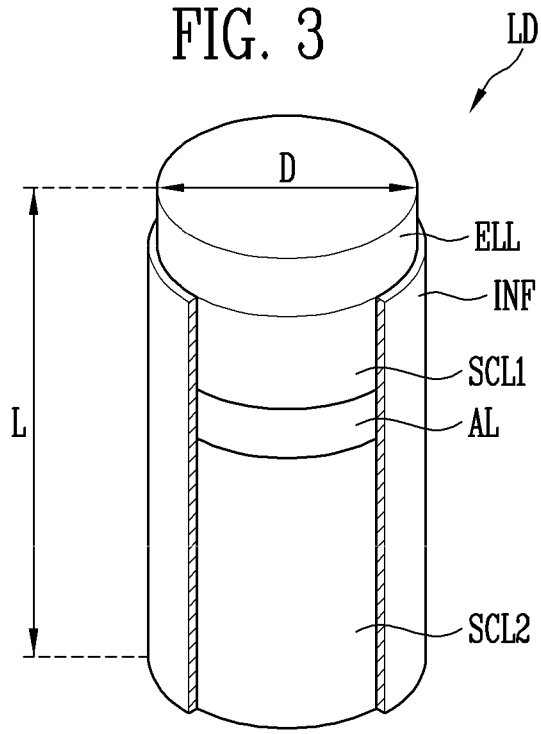
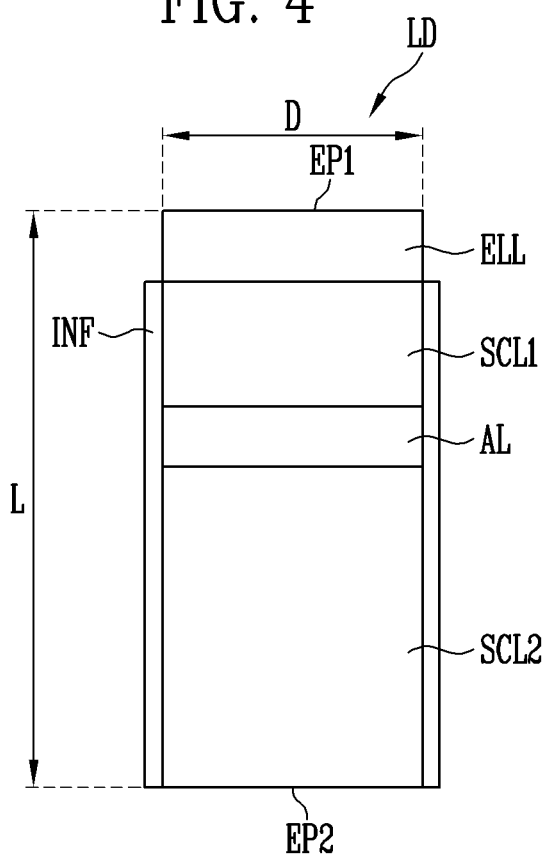

DISPLAY DEVICE

CROSS-REFERENCE TO RELATED APPLICATION

The present application claims priority under 35 U.S.C. § 119(a) to Korean patent application 10-2021-0191663 filed on Dec. 29, 2021, in the Korean Intellectual Property Office, the entire disclosure of which is incorporated herein by reference.

BACKGROUND

1. Technical Field

The present disclosure generally relates to a display device.

2. Related Art

Recently, as interest in information displays is increased, research and development of display devices have been continuously conducted.

SUMMARY

Embodiments provide a display device in which an area in which a light emitting element is disposed can be sufficiently secured.

In accordance with an aspect of the present disclosure, there is provided a display device including a pixel including a first sub-pixel emitting light of a first color and a second sub-pixel emitting light of a second color, wherein each of the first sub-pixel and the second sub-pixel includes: a pixel circuit layer disposed on a substrate, the pixel circuit layer including a pixel circuit, and a display element layer disposed on the pixel circuit layer, the display element layer including a light emitting element which includes an anode electrode and a cathode electrode, wherein the pixel circuit layer includes a first contact part disposed between the substrate and the display element layer, the anode electrode and the pixel circuit being connected to each other through the first contact part to supply an anode signal to the light emitting element, and wherein a plurality of first contact parts which include a first contact part in the first sub-pixel and a first contact part in the second sub-pixel are arranged along a first direction.

The pixel may further include a third sub-pixel emitting light of a third color and including a light emitting element which includes an anode electrode and a first contact part disposed between the substrate and the display element layer, the anode electrode of the third sub-pixel and a pixel circuit of the third sub-pixel being connected to each other through the first contact part in the third sub-pixel. A plurality of first contact parts which include the first contact part in the first sub-pixel, the first contact part in the second sub-pixel and the first contact part in the third sub-pixel area part may be arranged along the first direction.

Each of the first sub-pixel, the second sub-pixel, and the third sub-pixel may include an emission area in which light is emitted. The plurality of first contact parts may not overlap with the emission area of at least one of the first sub-pixel, the second sub-pixel, and the third sub-pixel along a second direction substantially perpendicular to the first direction.

The pixel circuit layer may further include an anode connection electrode disposed on the substrate. The anode electrode is electrically connected to a first end portion of the light emitting element and the cathode electrode is electrically connected to a second end portion of the light emitting element. The anode connection electrode may be electrically connected to the anode electrode through the first contact part.

The pixel circuit layer may further include: a cathode connection electrode disposed on the substrate; and a second contact part. The cathode connection electrode may be electrically connected to the cathode electrode through the second contact part.

The pixel circuit may include: a transistor; and a storage capacitor. The transistor may include: a first transistor electrode; a second transistor electrode; and a gate electrode. The anode connection electrode may be electrically connected to the first transistor electrode.

The display element layer may include: a first electrode and a second electrode, disposed on the pixel circuit layer; a first insulating layer disposed on the first electrode and the second electrode; a first contact electrode disposed on the first insulating layer; and a second contact electrode disposed on the first insulating layer. The first contact electrode may be electrically connected to the anode connection electrode through at least one of the plurality of first contact parts. The first contact electrode may be the anode electrode, and the second contact electrode may be the cathode electrode.

The display element layer may include: an alignment electrode including a first electrode and a second electrode, disposed on the pixel circuit layer; a first insulating layer disposed on the first electrode and the second electrode; a first contact electrode disposed on the first insulating layer; and a second contact electrode disposed on the first insulating layer. The first contact electrode may be electrically connected to the anode connection electrode through the first contact part. The first contact electrode may be the anode electrode and the second contact electrode may be the cathode electrode.

A direction in which the plurality of first contact parts are arranged may be different from a direction in which the first electrode and the second electrode extend.

The display element layer may include an alignment electrode including a first electrode and a second electrode disposed on the pixel circuit layer; a first insulating layer disposed on the first electrode and the second electrode; a first contact electrode disposed on the first insulating layer; and a second contact electrode disposed on the first insulating layer. The first electrode may be electrically connected to the anode connection electrode through the first contact part, and be electrically connected to the first contact electrode, and wherein the first electrode and the first contact electrode constitute the anode electrode.

The first transistor electrode, the second transistor electrode, and the gate electrode may be disposed on the same layer.

A direction in which the plurality of first contact parts are arranged may correspond to a direction in which the first sub-pixel and the second sub-pixel are arranged to be adjacent to each other.

The pixel circuit may include: a first pixel circuit as a pixel circuit for the first sub-pixel; and a second pixel circuit as a pixel circuit for the second sub-pixel. A direction in which the plurality of first contact parts are arranged may be different from a direction in which the first pixel circuit and the second pixel circuit are arranged to be adjacent to each other.

The pixel may include an emission area in which light is emitted. The plurality of first contact parts may be spaced apart from the emission area.

The pixel may include sub-pixels disposed adjacent to each other in a second direction different from the second direction, and wherein the plurality of first contact parts are disposed between the sub-pixels adjacent to each other.

The pixel circuit may include: a first pixel circuit as a pixel circuit for the first sub-pixel; and a second pixel circuit as a pixel circuit for the second sub-pixel. The plurality of first contact parts may overlap with the first pixel circuit and the second pixel circuit along a second direction in which the first pixel circuit and the second pixel circuit are arranged to be adjacent to each other.

The display device may include data lines electrically connected to the pixel circuit. A direction in which the plurality of first contact parts are arranged may be different from a direction in which the data lines extend.

The pixel circuit layer may include: an anode connection electrode disposed on the substrate; a cathode connection electrode disposed on the substrate; and a second contact part. The display element layer may include: a light emitting unit including the light emitting element; and a contact electrode layer electrically connected to at least a portion of the light emitting element. The light emitting unit may include: a first light emitting unit including a portion of the light emitting element; a second light emitting unit including a portion of the light emitting element; a third light emitting unit including a portion of the light emitting element; and a fourth light emitting unit including a portion of the light emitting element. The contact electrode layer may include: a first contact electrode electrically connected to one end of the light emitting element of the first light emitting unit, the first contact electrode being electrically connected to the anode connection electrode through one of the first contact parts; a second contact electrode electrically connected to the other end of the light emitting element of the first light emitting unit, the second contact electrode being electrically connected to one end of the light emitting element of the second light emitting unit; a third contact electrode electrically connected to the other end of the light emitting element of the second light emitting unit, the third contact electrode being electrically connected to one end of the light emitting element of the third light emitting unit; a fourth contact electrode electrically connected to the other end of the light emitting element of the third light emitting unit, the fourth contact electrode being electrically connected to one end of the light emitting element of the fourth light emitting unit; and a fifth contact electrode electrically connected to the other end of the light emitting element of the fourth light emitting unit, the fifth contact electrode being electrically connected to the cathode connection electrode through the second contact part.

The pixel may further include: a color conversion layer configured to change a wavelength of light; and a color filter layer configured to allow light to be selectively transmitted therethrough.

In accordance with another aspect of the present disclosure, there is provided a display device including a pixel including a plurality of sub-pixels each including a light emitting element, wherein the light emitting element emits light, based on an anode signal provided from an anode electrode disposed on a substrate, wherein the anode electrode is electrically connected to an anode connection electrode disposed on the substrate through an anode contact part formed through insulating layers disposed on the substrate, and wherein anode contact parts of the plurality of sub-pixels are disposed along a predetermined direction.

In accordance with still another aspect of the present disclosure, there is provided a display device including a pixel including a plurality of sub-pixels, wherein each of the plurality of sub-pixels includes: a pixel circuit layer disposed on a substrate, the pixel circuit layer including an anode connection electrode and a pixel circuit; and a display element layer disposed on the pixel circuit layer, the display element layer including a light emitting element and an anode electrode electrically connected to the light emitting element, wherein the anode electrode is electrically connected to the anode connection electrode through an anode contact part formed through insulating layers of the pixel circuit layer, wherein anode contact parts of the plurality of sub-pixels are arranged along a direction while being adjacent to one side of the plurality of sub-pixels.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 3 and 4 are schematic perspective and sectional views illustrating a light emitting element in accordance with another embodiment of the present disclosure.

DETAILED DESCRIPTION

The present disclosure may be modified to have different shape, therefore only particular examples are illustrated and described in detail. However, the examples do not limit to certain shapes but apply to all the change and equivalent material and replacement.

It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

The present disclosure generally relates to a display device. Hereinafter, a display device in accordance with an embodiment of the present disclosure will be described with reference to the accompanying drawings.

First, a light emitting element LD in accordance with an embodiment of the present disclosure will be described with reference to FIGS. 1 to 4.

Figure 1:
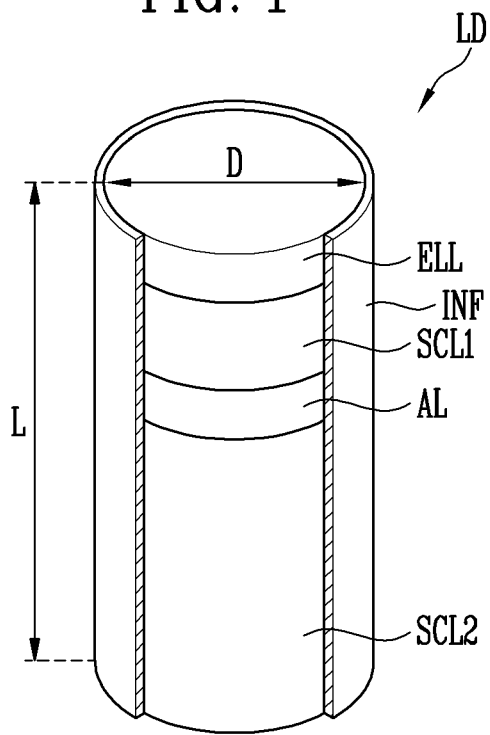
FIGS. 1 and 2 are schematic perspective and sectional views illustrating a light emitting element in accordance with an embodiment of the present disclosure.
Figure 2:
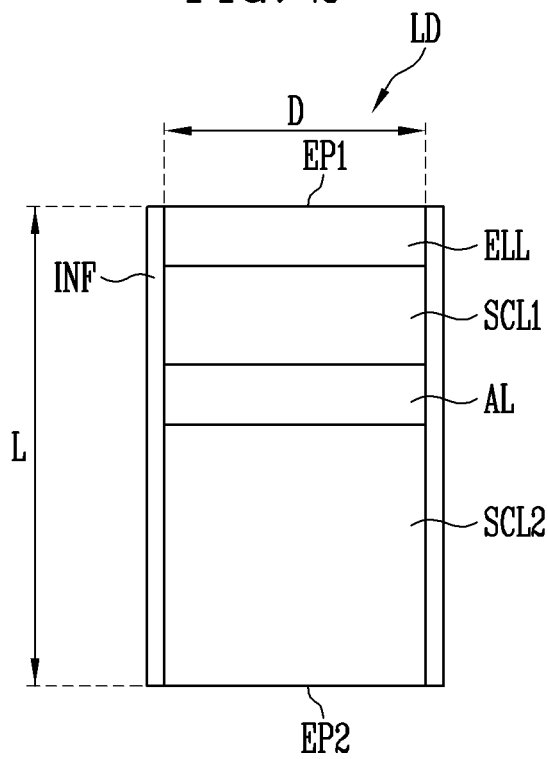

FIGS. 1 and 2 are schematic perspective and sectional views illustrating a light emitting element in accordance with an embodiment of the present disclosure. FIGS. 3 and 4 are schematic perspective and sectional views illustrating a light emitting element in accordance with another embodiment of the present disclosure.

Although a pillar-shaped light emitting element LD is illustrated in FIGS. 1 to 4, the kind and/or shape of the light emitting element LD is not limited thereto.

The light emitting element LD includes a first semiconductor layer SCL1, a second semiconductor layer SCL2, and an active layer AL interposed between the first and second semiconductor layers SCL1 and SCL2. For example, when assuming that an extending direction of the light emitting element LD is a length L direction, the light emitting element LD may include the first semiconductor layer SCL1, the active layer AL, and the second semiconductor layer SCL2 which are sequentially stacked along the length L direction. The light emitting element LD may further include an electrode layer ELL and an insulative film INF.

The light emitting element LD may be provided in a pillar shape extending along a length L direction. The light emitting element LD may have a first end portion EP1 and a second end portion EP2. close to the first end portion EP1, and the second semiconductor layer SCL2 may be disposed adjacent to the second end portion EP2. The electrode layer ELL may be disposed adjacent to the first end portion EP1.

The light emitting element LD may be a light emitting element manufactured in a pillar shape through an etching process, or the like. In this specification, the term "pillar shape" may include a rod-like shape or bar-like shape which is long in the length L direction (i.e., its aspect ratio is greater than 1), such as a cylinder or a polyprism, and the shape of its section is not particularly limited. For example, a length L of the light emitting element LD may be greater than a diameter D (or a width of a cross-section) of the light emitting element LD.

The light emitting element LD may have a size of nanometer scale to micrometer scale. For example, the light emitting element LD may have a diameter D (or width) in a range of nanometer scale to micrometer scale and/or a length L in a range of nanometer scale to micrometer scale. However, the size of the light emitting element LD is not limited thereto.

The first semiconductor layer SCL1 may be a first conductivity type semiconductor layer. The first semiconductor layer SCL1 is disposed on the active layer AL, and may include a semiconductor layer having a type different from a type of the second semiconductor layer SCL2. For example, the first semiconductor layer SCL1 may include a P-type semiconductor layer. In an example, the first semiconductor layer SCL1 may include at least one semiconductor material among InAlGaN, GaN, AlGaN, InGaN, AlN, and InN, and include a P-type semiconductor layer doped with a first conductivity type dopant such as Mg. However, the material constituting the first semiconductor layer SCL1 is not limited thereto. In addition, the first semiconductor layer SCL1 may be embodied by various materials.

The active layer AL is disposed between the first semiconductor layer SCL1 and the second semiconductor layer SCL2, and may be formed in a single-quantum well structure or a multi-quantum well structure. The position of the active layer AL is not limited to a specific example, and may be variously changed according to the kind of the light emitting element LD.

A clad layer (not shown) doped with a conductive dopant may be formed on the top and/or the bottom of the active layer AL. For example, the clad layer may be formed as an AlGaN layer or an InAlGaN layer. In some embodiments, a material such as AlGaN or AlInGaN may be used to form the active layer AL. In addition, the active layer AL may be embodied by various materials.

The second semiconductor layer SCL2 may be a second conductivity type semiconductor layer. The second semiconductor layer SCL2 is disposed on the active layer AL, and may include a semiconductor layer having a type different from the type of the first semiconductor layer SCL1. For example, the second semiconductor layer SCL2 may include an N-type semiconductor layer. For example, the second semiconductor layer SCL2 may include any one semiconductor material among InAlGaN, GaN, AlGaN, InGaN, AlN, and InN, and include an N-type semiconductor layer doped with a second conductivity type dopant such as Si, Ge or Sn. However, the material constituting the second semiconductor layer SCL2 is not limited thereto. In addition, the second semiconductor layer SCL2 may be embodied by various materials.

When a voltage which is greater than or equal to a threshold voltage is applied to both ends of the light emitting element LD, the light emitting element LD emits light when electron-hole pairs are combined in the active layer AL. The light emission of the light emitting element LD is controlled by using such a principle, so that the light emitting element LD can be used as a light source for various light emitting devices, including a pixel of a display device.

The insulative film INF may be disposed on a surface of the light emitting element LD. The insulative film INF may be formed on the surface of the light emitting element LD to surround an outer circumferential surface of at least the active layer AL. In addition, the insulative film INF may further surround one areas of the first and second semiconductor layers SCL1 and SCL2. The insulative film INF may be formed as a single layer or a multi-layer. However, the present disclosure is not limited thereto, and the insulative film INF may be embodied by a plurality of layers. For example, the insulative film INF may include a first insulating layer including a first material and a second insulating layer including a second material different from the first material.

The insulative film INF may expose both the end portions of the light emitting element LD. For example, the insulative film INF may expose one end of the electrode layer ELL and the second semiconductor layer SCL2 which are respectively disposed adjacent to the first and second end portions EP1 and EP2 of the light emitting element LD.

The insulative film INF may be configured as a single layer or a multi-layer, including one insulating material among silicon oxide ($SiO_x$), silicon nitride ($SiN_x$), silicon oxynitride ($SiO_xN_y$), aluminum oxide ($AlO_x$), and titanium oxide ($TiO_x$). However, the present disclosure is not necessarily limited to the above-described example. For example, in accordance with another embodiment, the insulative film INF may be omitted.

In accordance with an embodiment, when the insulative film INF is provided to cover the surface of the light emitting element LD, particularly, the outer circumferential surface of the active layer AL, the electrical stability of the light emitting element LD can be ensured. Also, when the insulative film INF is provided on the surface of the light emitting element LD, a surface defect of the light emitting element LD is minimized, thereby improving the lifetime and efficiency of the light emitting element LD. In addition, even when a plurality of light emitting elements LD are densely disposed, an unwanted short circuit can be prevented from occurring between the light emitting elements LD.

The electrode layer ELL may be disposed on the first semiconductor layer SCL1. The electrode layer ELL may be disposed adjacent to the first end portion EP1. The electrode layer ELL may be electrically connected to the first semiconductor layer SCL1.

A portion of the electrode layer ELL may be exposed. For example, the insulative film INF may expose one surface of the electrode layer ELL. The electrode layer ELL may be exposed in an area corresponding to the first end portion EP1.

In some embodiments, a side surface of the electrode layer ELL may be exposed (see FIGS. 3 and 4). For example, the insulative film INF may not cover at least a portion of the side surface of the electrode layer ELL while covering a side surface of each of the first semiconductor layer SCL1, the active layer AL, and the second semiconductor layer SCL2. Thus, the electrode layer ELL disposed adjacent to the first end portion EP1 can be easily connected to another component. In some embodiments, the insulating layer INF may expose not only the side surface of the electrode layer ELL but also a portion of a side surface of the first semiconductor layer SCL1 and/or the second semiconductor layer SCL2.

In accordance with an embodiment, the electrode layer ELL may be an ohmic contact electrode. However, the present disclosure is not necessarily limited to the above-described example. For example, the electrode layer ELL may be a Schottky contact electrode.

In accordance with an embodiment, the electrode layer ELL may include one of chromium (Cr), titanium (Ti), aluminum (Al), gold (Au), nickel (Ni), and any oxide or ally thereof. However, the present disclosure is not necessarily limited to the above-described example. In some embodiments, the electrode layer ELL may be substantially transparent. For example, the electrode layer ELL may include indium tin oxide (ITO). Accordingly, emitted light can be transmitted through the electrode layer ELL.

The structure, shape, and the like of the light emitting element LD are not limited to the above-described example. In some embodiments, the light emitting element LD may have various structures and various shapes. For example, the light emitting element LD may further include an additional electrode layer which is disposed on one surface of the second semiconductor layer SCL2 and is disposed adjacent to the second end portion EP2.

Figure 5:
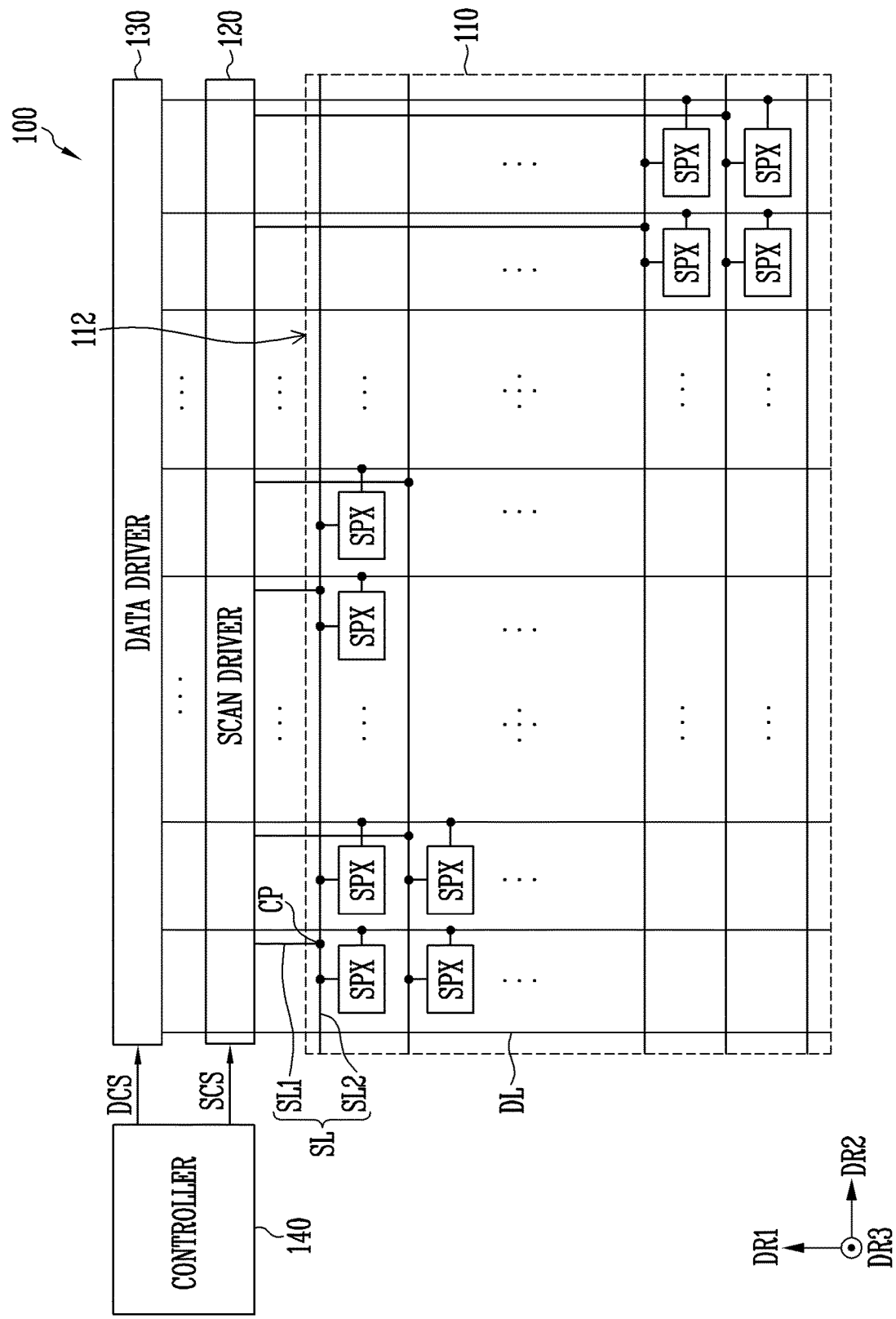
FIG. 5 is a block diagram illustrating a display device in accordance with an embodiment of the present disclosure.

FIG. 5 is a block diagram illustrating a display device in accordance with an embodiment of the present disclosure.

The display device 100 is configured to emit light. The display device 100 may be an electronic device using, as a light source, the light emitting element LD described above with reference to FIGS. 1 to 4. In accordance with an embodiment, the display device 100 may be one of a tablet PC, a television, a smart phone, and a notebook PC. However, the present disclosure is not necessarily limited to the above-described example. For example, the display device 100 may be applied to a vehicle infotainment system or be applied to smart glasses, a smart watch, and the like.

The display device 100 may include a pixel unit 100, a scan driver 120, a data driver 130, and a controller 140.

The pixel unit 110 may include a plurality of sub-pixels SPX connected to scan lines SL and data lines DL. In some embodiments, at least one of the sub-pixels PXL may form (or constitute a pixel (see 'PXL' shown in FIG. 9). For example, the sub-pixel SPX may include a first sub-pixel (see 'SPX1' shown in FIG. 10) emitting light of a first color (e.g., red), a second sub-pixel (see 'SPX2' shown in FIG. 10) emitting light of a second color (e.g., green), and a third sub-pixel (see 'SPX3' shown in FIG. 10) emitting light of a third color (e.g., blue).

The scan driver 120 may be disposed at one side 112 of the pixel unit 110. The scan driver 120 may receive a first control signal SCS from the controller 140. The scan driver 120 may provide a scan signal to the sub-pixel SPX. The scan driver 120 may supply the scan signal to the scan lines SL in response to the first control signal SCS. For example, the scan signal may be provided to the sub-pixel SPX through a first scan line SL1 extending in a first direction DR1 and a second scan line SL2 extending in a second direction DR2.

The first control signal SCS may be a signal for controlling a driving timing of the scan driver 120. The first control signal SCS may include a scan start signal and a plurality of clock signals. The scan signal may be set to a gate-on level corresponding to the type of a transistor to which the corresponding scan signal is supplied.

The data driver 130 may be disposed at the one side 112 of the pixel unit 110. The data driver 130 may receive a second control signal DCS from the controller 140. The data driver 130 may provide a data signal to the sub-pixel SPX. The data driver 130 may supply the data signal to the data line DL in response to the second control signal DCS.

The second control signal DCS may be a signal for controlling a driving timing of the data driver 130.

In accordance with an embodiment, the display device 100 may further include a compensator (not shown). The compensator may receive a third control signal for sensing of the sub-pixels SPX and degradation compensation from the controller 140. The compensator may receive a sensing value (current or voltage information) extracted from the sub-pixel SPX through a sensing line ('SENL' shown in FIG. 6). The compensator may generate a compensation value for compensating for degradation of the sub-pixel SPX based on the sensing value.

The scan driver 120 and the data driver 130 are disposed at the one side 112 of the pixel unit 110. The scan driver 120 and the data driver 130 may be disposed at the same side with respect to the pixel unit 110. For example, when the display device 100 generally includes four sides, the scan driver 120 and the data driver 130 may be disposed adjacent to any one side of the four sides.

In accordance with an embodiment, in order to form the single side driving structure of the display device 100, the scan line SL may include the first scan line SL1 and the second scan line SL2 which extend in different directions.

The first scan line SL1 may extend in the first direction DR1 to be electrically connected to the second scan line SL2 through a contact member CP. The first scan line SL1 may be electrically connected to the scan driver 120 and the second scan line SL2.

The second scan line SL2 may extend in the second direction DR2 to be electrically connected to a sub-pixel SPX of a pixel row corresponding thereto. The second scan line SL2 may supply the scan signal to the sub-pixel SPX. A pixel row direction is a horizontal direction and may mean the second direction DR2. A pixel column direction is a vertical direction and may mean the first direction DR1. The pixel row may be defined by the second scan line SL2. The pixel row direction may be equal (or substantially parallel) to a direction in which the one side 112 of the pixel unit 110, at which the scan driver 120 and the data driver 130 are disposed, extends.

The second scan line SL2 may be connected to at least one first scan line SL1. For example, referring to a pixel row illustrated at a top side of the pixel unit 110 shown in FIG. 5, the second scan line SL2 may be electrically connected to any one of the first scan lines SL1 in one area, and be electrically connected to another of the first scan lines SL1 in another area.

The data line DL may extend along a pixel column direction (e.g., the first direction DR1) to be electrically connected to a sub-pixel SPX. The data line DL may supply a data signal to the sub-pixel SPX connected thereto.

Although a case where the scan driver 120, the data driver 130, and the controller 140 are separated from one another is illustrated in FIG. 5, at least some of the scan driver 120, the data driver 130, and the controller 140 may be integrated as one module or one integrated circuit chip (IC chip). For example, a configuration and/or functions of at least a portion of the controller 140 may be included in the data driver 130.

In some embodiments, the scan driver 120 may be embodied by a plurality of scan drivers (e.g., a plurality of scan driving chips or a plurality of scan driving circuits) which respectively drive sub-pixels in an area of the pixel unit 110. The data driver 130 may be embodied by a plurality of data drivers (e.g., a plurality of data driving chips or a plurality of data driving circuits) which respectively drive sub-pixels in an area of the pixel unit 110.

Figure 6:
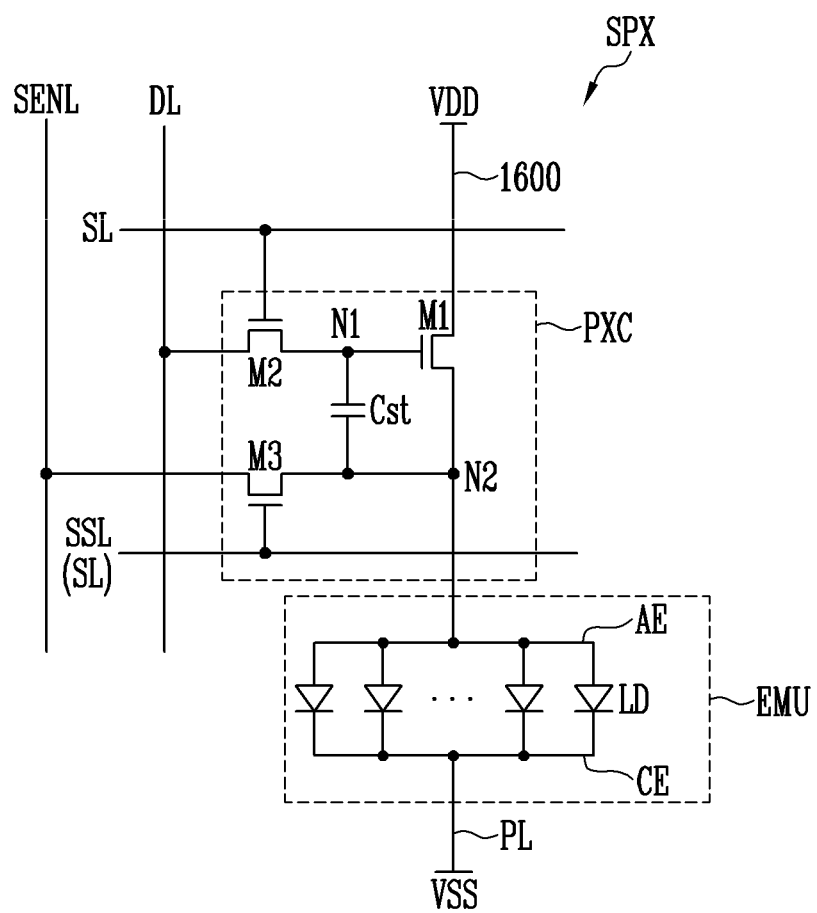
FIG. 6 is a diagram illustrating a pixel circuit included in a sub-pixel in accordance with an embodiment of the present disclosure.

FIG. 6 is a diagram illustrating a pixel circuit included in a sub-pixel in accordance with an embodiment of the present disclosure. The sub-pixel SPX shown in FIG. 6 may mean any one of the sub-pixels SPX described above with reference to FIG. 5.

Referring to FIG. 6, the sub-pixel SPX may include a pixel circuit PXC which is connected to a light emitting unit EMU.

The sub-pixel SPX may be electrically connected to a scan lines SL, a data line DL, a first power line VDD, and a second power line VSS. The scan line SL may mean the above-described second scan line SL2. For convenience of description, the second scan line SL2 is designated as the scan line SL. In some embodiments, the sub-pixel SPX may be selectively further connected to another power line and/or another signal line.

The sub-pixel SPX may include the light emitting unit EMU configured to emit light corresponding to a data signal provided from the data line DL.

The pixel circuit PXC may be connected between the first power line VDD and the light emitting unit EMU. The pixel circuit PXC may be electrically connected to the scan line SL to which a first scan signal is supplied and the data line DL to which a data signal is supplied. Also, the pixel circuit PXC may be electrically connected to a control line SSL to which a second scan signal is supplied, and be electrically connected to a sensing line SENL connected to a reference power source (or initialization power source) or a sensing circuit. In some embodiments, the second scan signal may be equal to or different from the first scan signal. When the second scan signal is equal to the first scan signal, the control line SSL may be connected to the scan line SL.

The pixel circuit PXC may include at least one transistor and a capacitor. For example, the pixel circuit PXC may include a first transistor M1, a second transistor M2, a third transistor M3, and a capacitor Cst.

The first transistor M1 may be connected between the first power line VDD and a second node N2. The second node N2 may be a node at which the pixel circuit PXC and the light emitting unit EMU are connected to each other. For example, the second node N2 may be a node at which one electrode (e.g., a drain electrode) of the first transistor M1 and an anode electrode AE of the light emitting unit EMU are connected to each other. A gate electrode of the first transistor M1 may be connected to a first node N1. The first transistor M1 may control a driving current supplied to the light emitting unit EMU corresponding to a voltage of the first node N1.

The second transistor M2 may be connected between the data line DL and the first node N1. In addition, a gate electrode of the second transistor M2 may be connected to the scan line SL. The second transistor M2 may be turned on when the first scan signal having a gate-on voltage (e.g., a high level voltage) is supplied from the scan line SL to connect the data line DL and the first node N1 to each other.

A data signal of a corresponding frame is supplied to the data line for each frame period. The data signal is transferred to the first node N1 through the second transistor M2 during a period in which the first scan signal having the gate-on voltage is supplied. That is, the second transistor M2 may be a switching transistor for transferring each data signal to the inside of the sub-pixel SPX.

One electrode of the capacitor Cst may be connected to the first node N1, and the other electrode of the capacitor Cst may be connected to the second node N2. The capacitor Cst charges a voltage corresponding to the data signal supplied to the first node N1 during each frame period.

The third transistor M3 may be connected between the second node N2 and the sensing line SENL. In addition, a gate electrode of the third transistor M3 may be connected to the control line SSL (or the scan line SL). The third transistor M3 may be turned on when the second scan signal (or the first scan signal) having the gate-on voltage (e.g., the high level voltage) is supplied from the control line SSL to transfer, to the second node N2, a reference voltage (or initialization voltage) supplied to the sensing line SENL, or to transfer a voltage of the second node N2 to the sensing line SENL. The voltage of the second node N2, which is transferred to the sensing circuit through the sensing line SENL, may be provided to an external circuit (e.g., the controller 140) to be used for compensating for a characteristic deviation of sub-pixels SPX, and the like.

Meanwhile, although a case where the transistors included in the pixel circuit PXC are all N-type transistors is illustrated in FIG. 6, the present disclosure is not limited thereto. For example, at least one of the first, second, and third transistors M1, M2, and M3 may be embodied as a P-type transistor. In addition, the structure and driving method of the sub-pixel SPX may be variously changed in some embodiments.

The light emitting unit EMU may include the anode electrode AE, a cathode electrode CE, and at least one light emitting element LD. For example, the light emitting unit EMU may include the anode electrode AE connected to the first power line VDD through the first transistor M1, the cathode electrode CE connected to the second power line VSS, and the at least one light emitting elements LD connected between the anode electrode AE and the cathode electrode CE. In an embodiment, the light emitting unit EMU may include a plurality of light emitting elements LD connected in parallel between the anode electrode AE and the cathode electrode CE.

A power source of the first power line VDD and a power source of the second power line VSS may have different potentials. For example, the power source of the first power line VDD may be a high-potential pixel power source and the power source of the second power line VSS may be a low-potential pixel power source. A potential difference between the power source of the first power line VDD and the power source of the second power line VSS may be set equal to or higher than a threshold voltage of the light emitting elements LD.

The first power line VDD may be electrically connected to the first transistor M1 by a transistor connection electrode 1600. The second power line VSS may be electrically connected to the cathode electrode CE by a power line PL.

The emitting elements LD may be connected in a forward direction between the first power line VDD and the second power line VSS to form respective effective light sources. These effective light sources constitute the light emitting unit EMU of the sub-pixel SPX.

The light emitting elements LD may emit light with a luminance corresponding to a driving current supplied through the pixel circuit PXC. The pixel circuit PXC may supply a driving current corresponding to a data signal to the light emitting unit EMU during each frame period. The driving current supplied to the light emitting unit EMU may flow through the light emitting elements LD. Accordingly, the light emitting unit EMU can emit light with a luminance corresponding to the driving current while each light emitting element LD emits light with a luminance corresponding to a current flowing therethrough.

Meanwhile, although an embodiment in which the sub-pixel SPX includes the light emitting unit EMU having a parallel structure is disclosed in FIG. 6, the present disclosure is not limited thereto. For example, the sub-pixel SPX may include a light emitting unit EMU having a serial structure or a series/parallel structure. The light emitting unit EMU may include a plurality of light emitting elements LD connected in series or series/parallel between the anode electrode AE and the cathode electrode CE. Alternatively, the sub-pixel SPX may include only a single light emitting element LD connected between the anode electrode AE and the cathode electrode CE.

The pixel circuit of the sub-pixel SPX in accordance with the embodiment of the present disclosure is not limited to the above-described example. In some embodiments, the pixel circuit PXC may include seven transistors and one storage capacitor.

Hereinafter, a structure of electrodes of the display device 100 in accordance with an embodiment of the present disclosure will be described.

Figure 7:
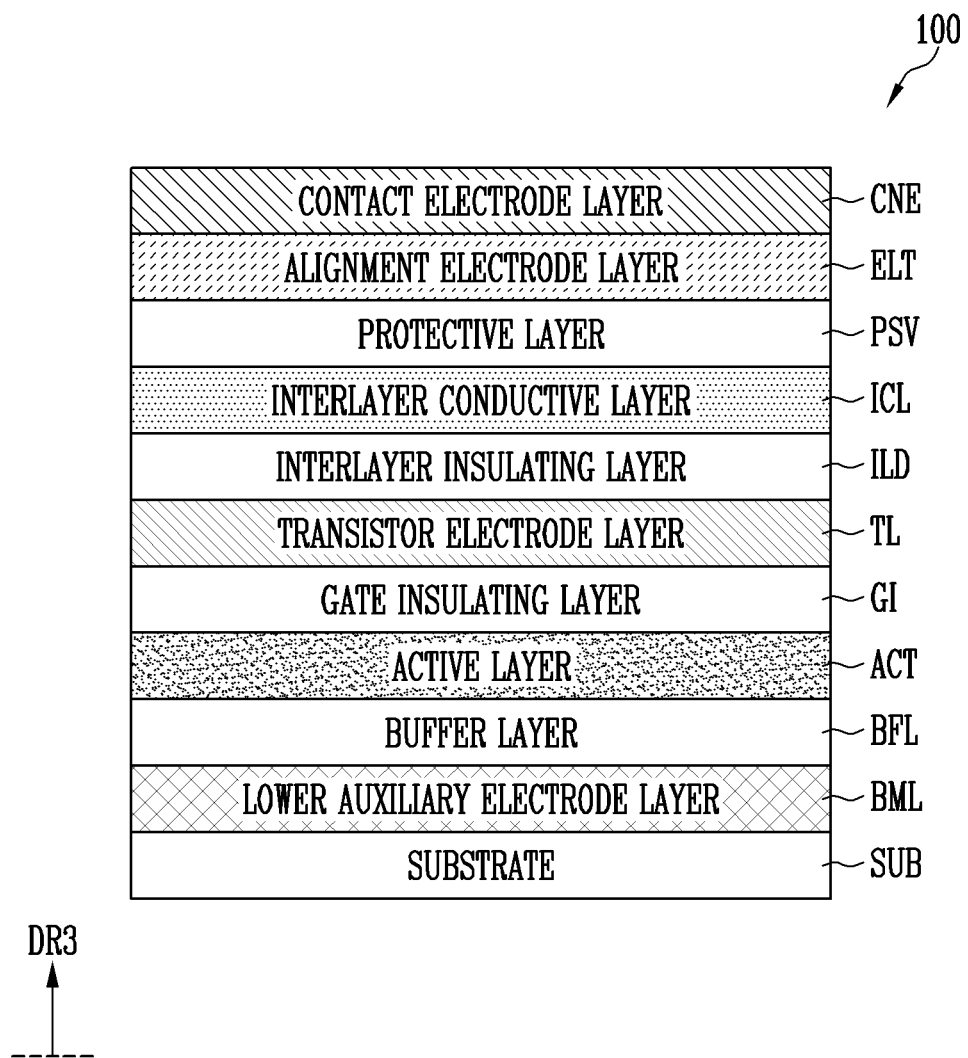
FIG. 7 is a sectional view illustrating a stacked structure included in the display device in accordance with an embodiment of the present disclosure.

First, a stacked structure of the display device 100 will be described with reference to FIG. 7. FIG. 7 is a sectional view illustrating a stacked structure included in the display device in accordance with an embodiment of the present disclosure.

Referring to FIG. 7, the stacked structure included in the display device 100 in accordance with an embodiment of the present disclosure may include a substrate SUB, a lower auxiliary electrode layer BML, a buffer layer BFL, an active layer ACT, a gate insulating layer GI, a transistor electrode layer TL, an interlayer insulating layer ILD, an interlayer conductive layer ICL, a protective layer PSV, an alignment electrode layer ELT, and a contact electrode layer CNE which are sequentially stacked. The layers in the stacked structure may be patterned to have a specific configuration.

The substrate SUB forms (or constitute) a base member of the display device 100, and may include a rigid or flexible substrate or film. The material constituting the substrate SUB is not limited to a specific example, and the substrate SUB may include various materials.

The buffer layer BFL may be a layer for preventing an impurity from being diffused into the active layer ACT including a semiconductor or preventing moisture from infiltrating into the active layer ACT. In accordance with an embodiment, the buffer layer BFL may include one of silicon nitride ($SiN_x$), silicon oxide ($SiO_x$), silicon oxynitride ($SiO_xN_y$), and aluminum oxide ($AlO_x$). However, the present disclosure is not necessarily limited to the above-described example.

Figure 13:
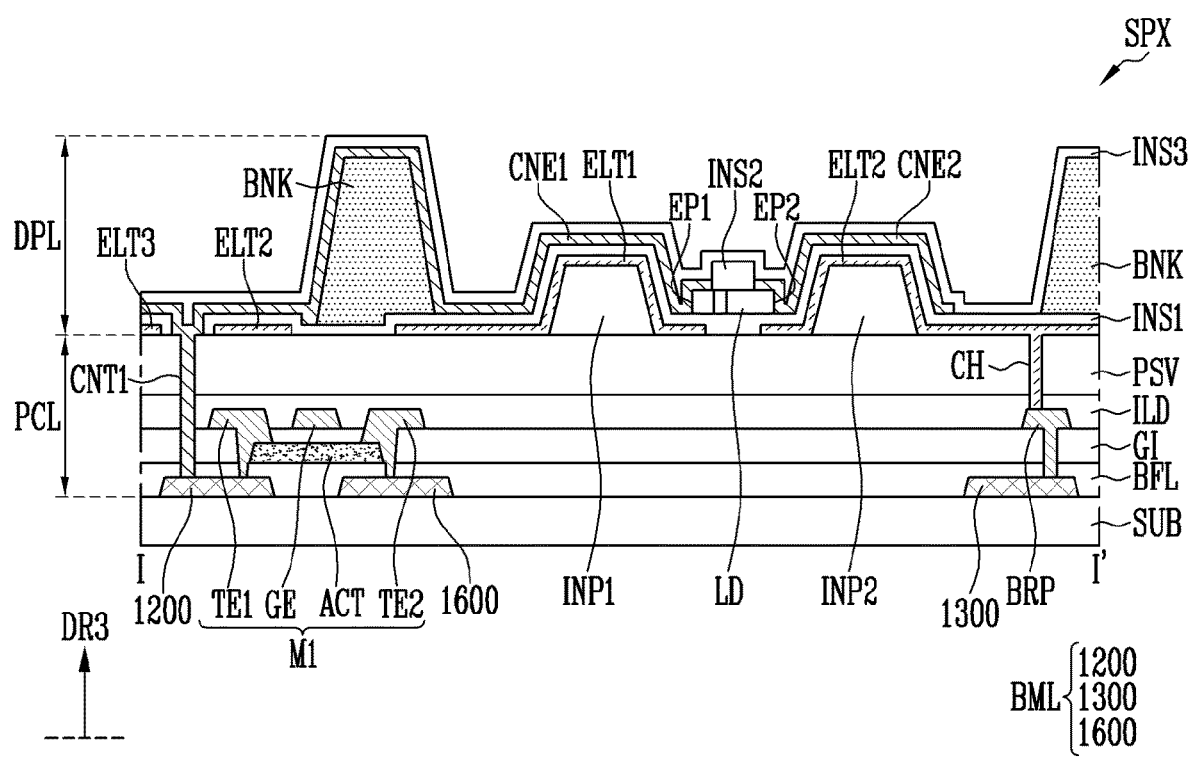
FIG. 13 is a schematic sectional view taken along line I-I' shown in FIG. 11.

The active layer ACT may include a semiconductor. For example, the active layer ACT may include one of poly-silicon, Low Temperature Polycrystalline Silicon (LTPS), amorphous silicon, and an oxide semiconductor. In accordance with an embodiment, the active layer ACT may form (or constitute) a channel of the first to third transistors M1 to M3, and an impurity may be doped into portions of the transistor electrode layer TL which are in contact with first and second transistor electrodes ('TE1' and 'TE2,' which are shown in FIG. 13).

The lower auxiliary electrode layer BML, the transistor electrode layer TL, the interlayer conductive layer ICL, the alignment electrode layer ELT, and the contact electrode layer CNE may be layers including a conductive material.

In accordance with an embodiment, each of the lower auxiliary electrode layer BML, the transistor electrode layer TL, and the interlayer conductive layer ICL may be embodied as a single layer or a multi-layer. In accordance with an embodiment, each of the lower auxiliary electrode layer BML, the transistor electrode layer TL, and the interlayer conductive layer ICL may include any one of gold (Au), silver (Ag), aluminum (Al), molybdenum (Mo), chromium (Cr), titanium (Ti), nickel (Ni), neodymium (Nd), copper (Cu), and platinum (Pt). However, the present disclosure is not necessarily limited to the above-described example.

The gate insulating layer GI, the interlayer insulating layer ILD, and the protective layer PSV may be interposed between the active layer ACT, the transistor electrode TL, the interlayer conductive layer ICL, and the alignment electrode layer ELT to electrically separate the active layer ACT, the transistor electrode TL, the interlayer conductive layer ICL, and the alignment electrode layer ELT from each other. In accordance with an embodiment, electrode patterns may be electrically connected to each other through contact holes (e.g., a contact hole ('CH' shown in FIG. 9), a first contact part ('CNT1' shown in FIG. 9), and a second contact part ('CNT2' shown in FIG. 9)) formed in any one of the gate insulating layer GI, the interlayer insulating layer ILD, and the protective layer PSV.

In accordance with an embodiment, the gate insulating layer GI, the interlayer insulating layer ILD, and the protective layer PSV may include one of silicon nitride ($SiN_x$), silicon oxide ($SiO_x$), silicon oxynitride ($SiO_xN_y$), and aluminum oxide ($AlO_x$). However, the present disclosure is not necessarily limited to the above-described example. In some embodiments, gate insulating layer GI, the interlayer insulating layer ILD, and the protective layer PSV may include an organic material, and be embodied by a single layer or a plurality of layers.

In accordance with an embodiment, the alignment electrode layer ELT may include a conductive material. For example, the alignment electrode layer ELT may include one of molybdenum (Mo), a magnesium (Mg), silver (Ag), platinum (Pt), palladium (Pd), gold (Au), nickel (Ni), neodymium (Nd), iridium (Ir), chromium (Cr), titanium (Ti), copper (Cu), and aluminum (Al). However, the present disclosure is not necessarily limited to the above-described example.

In accordance with an embodiment, the contact electrode layer CNE may include a conductive material. The contact electrode layer CNE may be electrically connected to at least a portion of the light emitting element LD. In some embodiments, the contact electrode layer CNE may include a transparent conductive material. For example, contact electrode layer CNE may include a transparent conductive material including Indium Tin Oxide (ITO), Indium Zinc Oxide (IZO), and Indium Tin Zinc Oxide (ITZO), but the present disclosure is not necessarily limited thereto.

An insulating layer may be interposed between the alignment electrode layer ELT and the contact electrode layer CNE to be electrically separated from each other. For example, the contact electrode layer CNE and the alignment electrode layer ELT may be separated from each other by a first insulating layer (see 'INS1' shown in FIG. 13).

Figure 8:
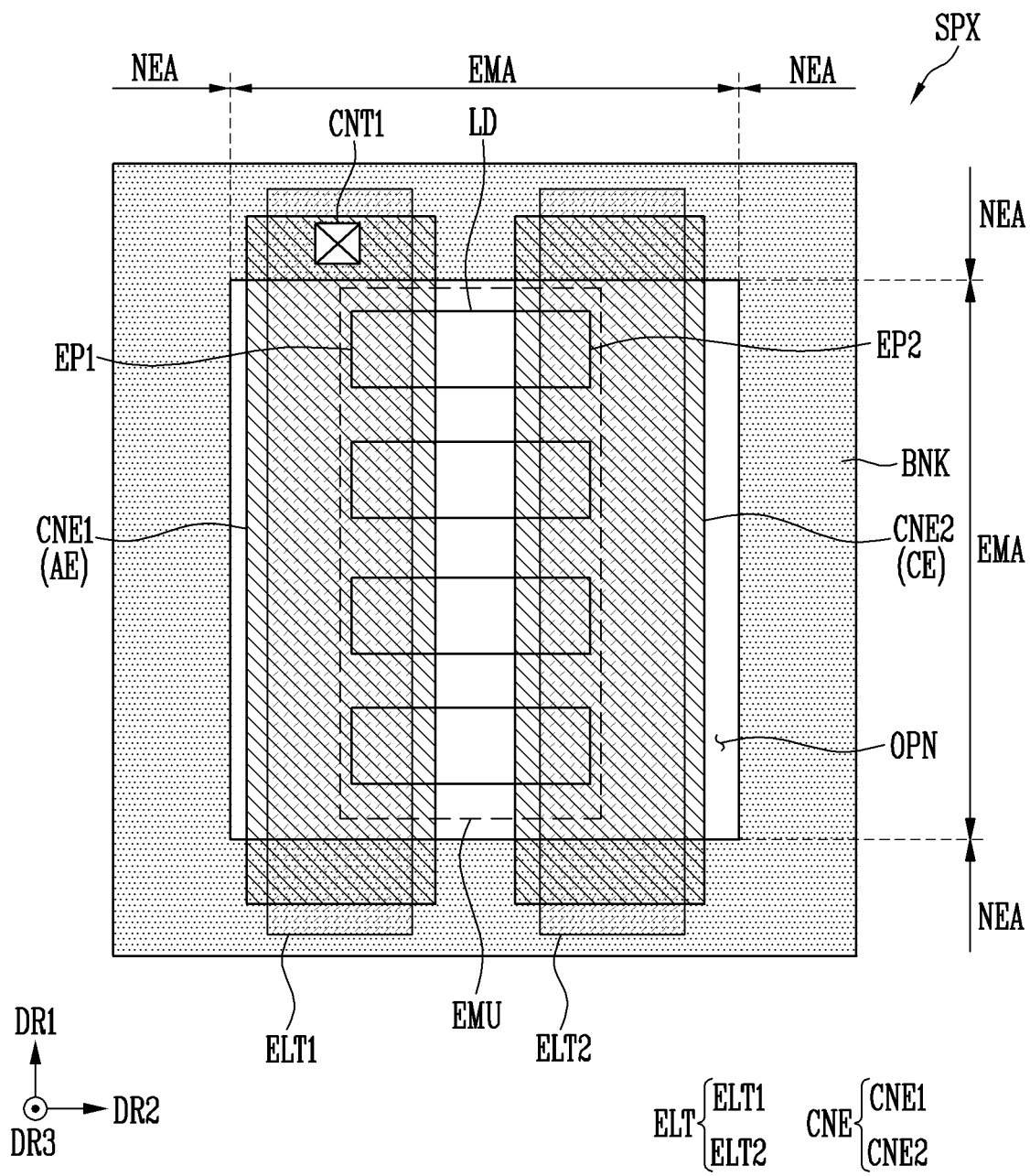
FIG. 8 is a schematic plan view illustrating a sub-pixel in accordance with an embodiment of the present disclosure.

Next, a structure in which light emitting elements LD are disposed in a sub-pixel SPX will be described with reference to FIG. 8. FIG. 8 is a schematic plan view illustrating a sub-pixel in accordance with an embodiment of the present disclosure. FIG. 8 is a view illustrating light emitting elements LD and components adjacent thereto in a sub-pixel SPX included in a pixel PXL in accordance with an embodiment of the present disclosure. FIG. 8 may be a view generally illustrating a structure including an emission area EMA and a non-emission area NEA of the sub-pixel SPX.

Referring to FIG. 8, the sub-pixel SPX (or the display device 100) may include the emission area EMA and the non-emission area NEA. The sub-pixel SPX may include an alignment electrode layer ELT, light emitting elements LD, a bank BNK, a first contact part CNT1, and a contact electrode layer CNE.

In accordance with an embodiment, the alignment electrode layer ELT may include a first electrode ELT1 and a second electrode ELT2. The contact electrode layer CNE may include a first contact electrode CNE1 and a second contact electrode CNE2.

The emission area EMA may be an area in which the light emitting elements LD are provided to emit light. The non-emission area NEA may be an area in which the light emitting elements LD are not disposed and light is not emitted. The emission area EMA may overlap with an opening OPN defined by the bank BNK in a plan view. The light emitting elements LD may be disposed in the emission area EMA.

The light emitting elements LD may not be disposed in the non-emission area NEA. A portion of the non-emission area NEA may overlap with the bank BNK in a plan view.

The bank BNK may form (or provide) the opening OPN. For example, the bank BNK may have a shape protruding in a thickness direction of the substrate SUB (e.g., a third direction DR3) and have a form in which the bank BNK surrounds a predetermined area. Accordingly, the opening OPN in which the bank BNK is not disposed may be formed. In some embodiments, the bank BNK may form a space in which a fluid can be accommodated. For example, an ink including the light emitting elements LD may be provided in the space formed by the opening OPN in the bank BNK, so that the light emitting elements LD are disposed in the opening OPN.

The bank BNK may define the emission area EMA and the non-emission area NEA. The bank BNK may surround at least a portion of the emission area EMA in a plan view. For example, an area in which the bank BNK is disposed may be the non-emission area NEA. An area in which the light emitting elements LD are disposed may be the emission area EMA.

At least a portion of the light emitting element LD may be disposed between the first electrode ELT1 and the second electrode ELT2. The light emitting element LD may be aligned between the first electrode ELT1 and the second electrode ELT2. The light emitting elements LD may form (or constitute) a light emitting unit EMU. The light emitting unit EMU may mean a unit including adjacent light emitting elements LD.

The first electrode ELT1 and the second electrode ELT2 may be spaced apart from each other. For example, the first electrode ELT1 and the second electrode ELT2 may be spaced apart from each other along the second direction DR2 in the emission area EMA and each of the first electrode ELT1 and the second electrode ELT2 may extend along the first direction DR1.

In some embodiments, the first electrode ELT1 may be a first alignment electrode, and the second electrode ELT2 may be a second alignment electrode.

The first electrode ELT1 and the second electrode ELT2 may be respectively supplied with a first alignment signal and a second alignment signal in a process of aligning the light emitting elements LD. The first alignment signal and the second alignment signal may have different waveforms, different potentials, and/or different phases. Accordingly, an electric field is formed between the first electrode ELT1 and the second electrode ELT2 so that the light emitting elements can be aligned between the first electrode ELT1 and the second electrode ELT2.

Each of the first and second electrodes ELT1 and ELT2 may be configured as a single layer or a multi-layer. For example, each of the first and second electrodes ELT1 and ELT2 may include at least one reflective electrode layer including a reflective conductive material, and selectively further include a least one transparent electrode layer and/or at least one conductive capping layer.

The light emitting elements LD may be aligned between the first electrode ELT1 and the second electrode ELT2. For example, the light emitting elements LD may be aligned and/or connected in parallel between the first electrode ELT1 and the second electrode ELT2.

In an embodiment, each light emitting element LD may be aligned in the second direction DR2 between the first electrode ELT1 and the second electrode ELT2.

A first end portion EP1 of the light emitting element LD may be disposed adjacent to the first electrode ELT1 and a second end portion EP2 of the light emitting element LD may be disposed adjacent to the second electrode ELT2. The first end portion EP1 may or may not overlap with the first electrode ELT1. The second end portion EP2 may or may not overlap with the second electrode ELT2.

The light emitting element LD may emit light based on an electrical signal provided from the first contact electrode CNE1 and the second contact electrode CNE2.

The first contact electrode CNE1 may serve as an anode electrode AE, thereby providing an electrical signal to the light emitting element LD. The first contact electrode CNE1 may be disposed adjacent to the first end portion EP1 of the light emitting element LD.

The first contact electrode CNE1 may be disposed on the first electrode ELT1 to be electrically connected to the light emitting element LD. The first contact electrode CNE1 may be electrically connected to the light emitting element LD to provide an anode signal to the light emitting element LD. The first contact electrode CNE1 may be electrically connected to the pixel circuit PXC (e.g., the first transistor M1) through the first contact part CNT1. In this specification, the first contact part CNT1 may mean a component connecting the anode electrode AE and one component of a pixel circuit layer ('PCL' shown in FIG. 13) to each other. The first contact part CNT1 may be designated as an anode contact part.

The second contact electrode CNE2 may serve as a cathode electrode CE, thereby providing an electrical signal to the light emitting element LD. The second contact electrode CNE2 may be disposed adjacent to the second end portion EP2 of the light emitting element LD.

The second contact electrode CNE2 may be disposed on the second electrode ELT2 to be electrically connected to the light emitting element LD. The second contact electrode CNE2 may be electrically connected to the light emitting element LD to provide a cathode signal to the light emitting element LD. In accordance with an embodiment, the second contact electrode CNE2 may be electrically connected to third to fifth contact electrode ('CNE3 to CNE5' shown in FIG. 11), and the fifth contact electrode CNE5 may be electrically connected to the power line PL through a second contact part CNT2. In this specification, the second contact part CNT2 may mean a component connecting the cathode electrode CE and the power line PL to each other. The second contact part CNT2 may be designated a cathode contact part.

Figure 9:
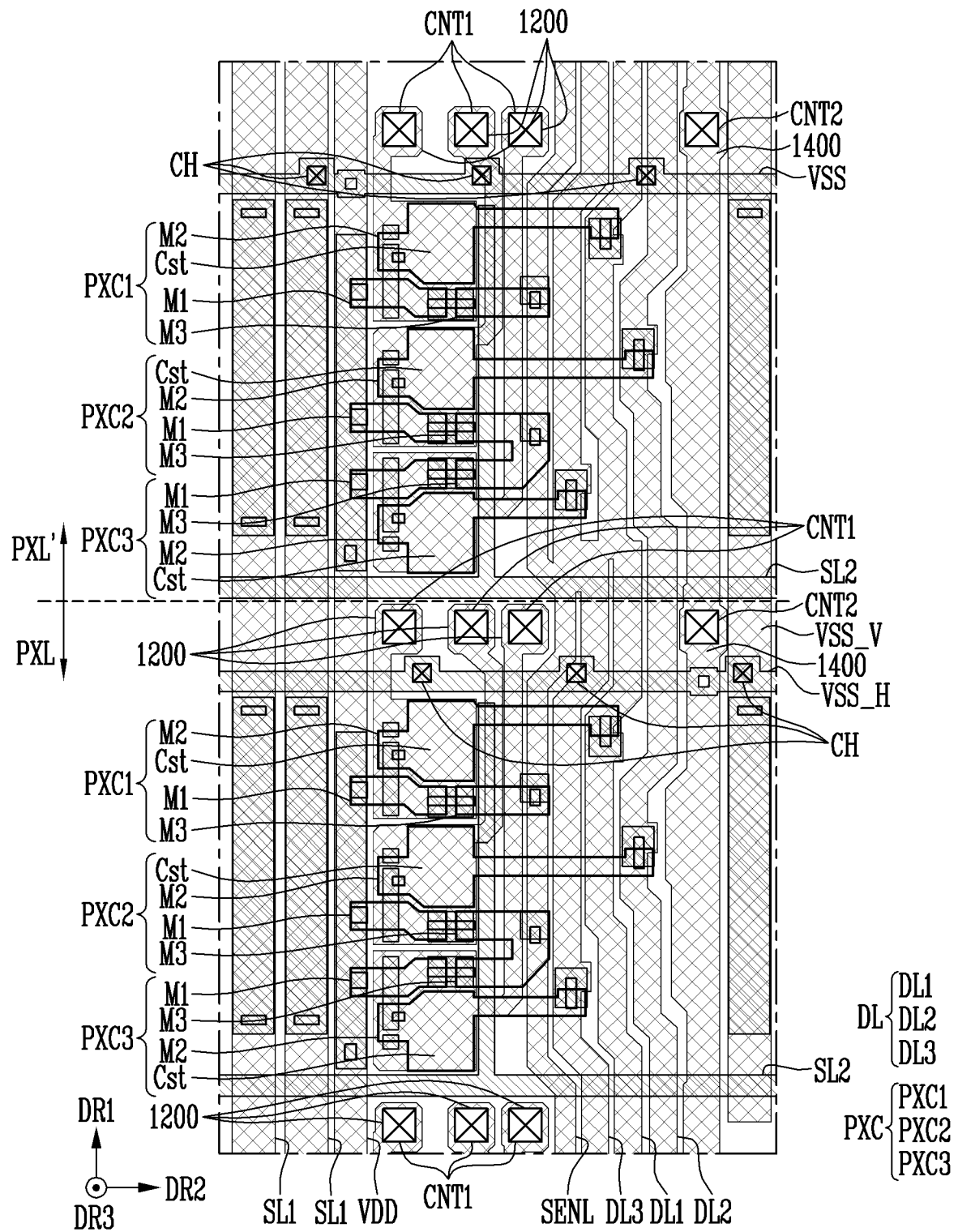
FIGS. 9 and 10 are schematic layout views illustrating electrodes included in a pixel in accordance with an embodiment of the present disclosure.
Figure 10:
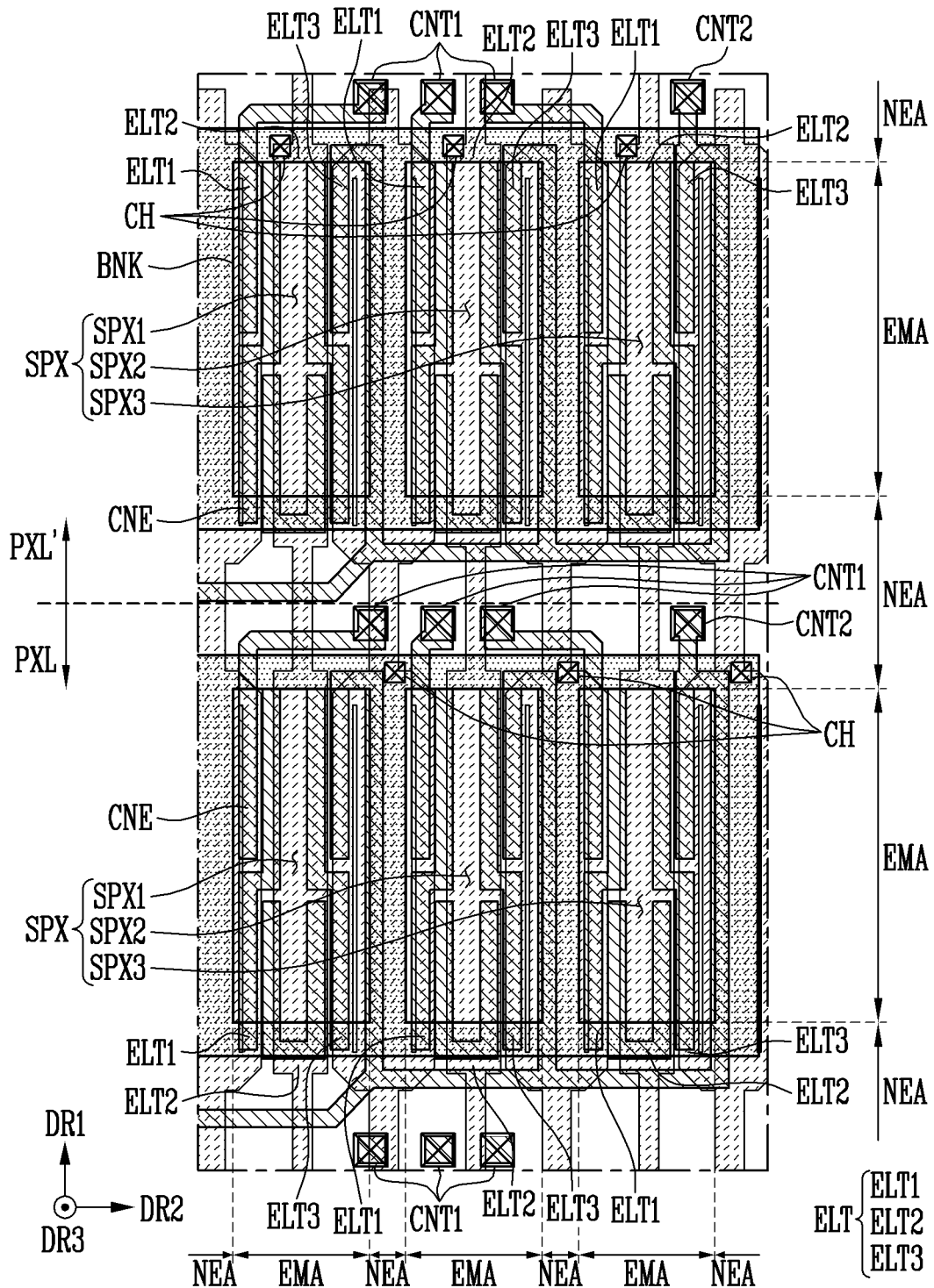
Figure 11:
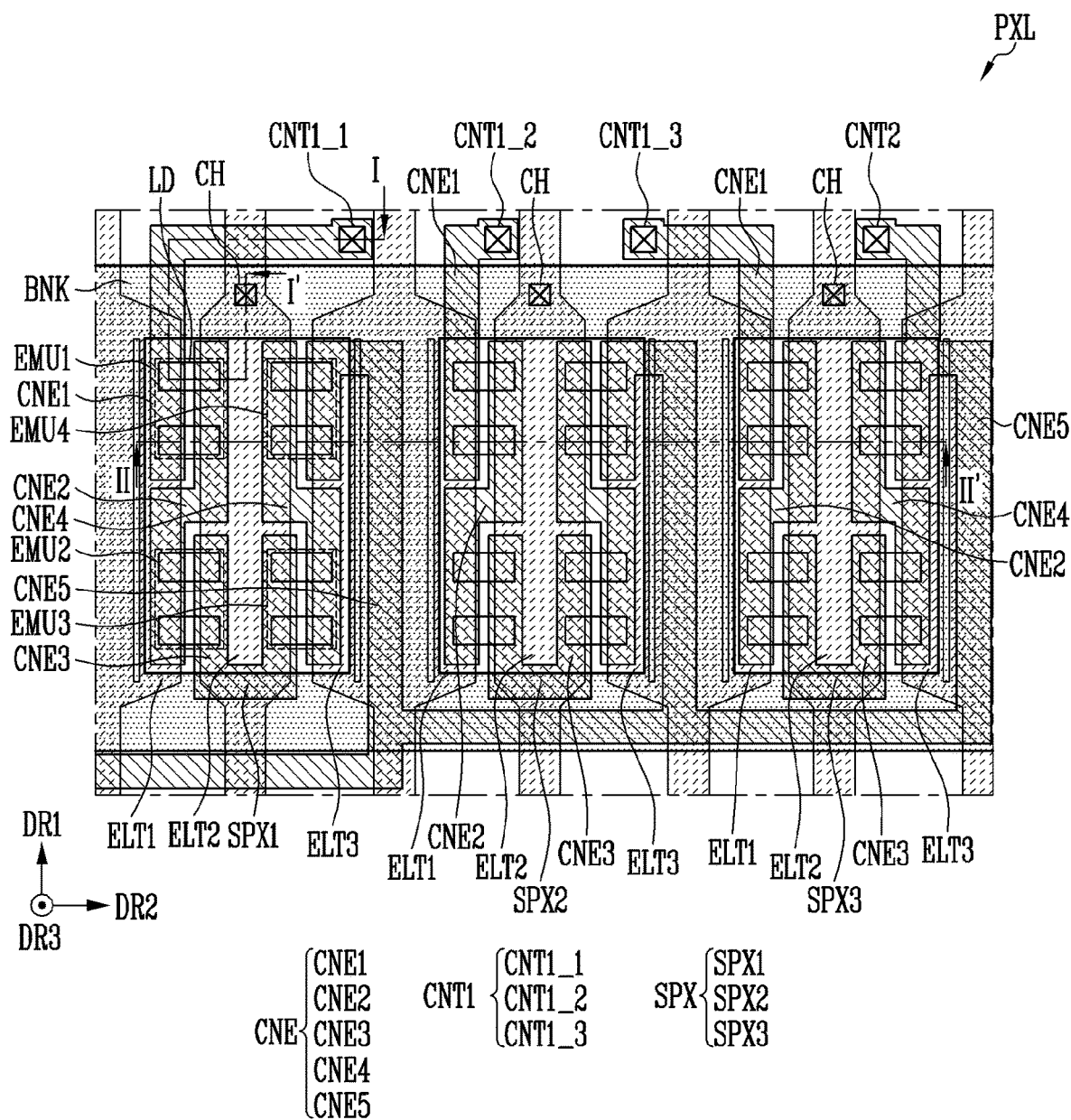
FIG. 11 is a schematic plan view illustrating a pixel in accordance with an embodiment of the present disclosure.

Next, an electrode structure of a pixel PXL in accordance with an embodiment of the present disclosure will be described in more detail with reference to FIGS. 9 to 11. In FIGS. 9 to 11, portions overlapping with those described above will be simplified or omitted.

FIGS. 9 and 10 are schematic layout views illustrating electrodes included in a pixel in accordance with an embodiment of the present disclosure.

In FIGS. 9 and 10, electrodes of the pixel PXL are illustrated. In FIGS. 9 and 10, different layers disposed in the same area are illustrated. In FIGS. 9 and 10, pixels PXL and PXL' adjacent to each other in a direction (e.g., the first direction DR1) are illustrated.

In FIG. 9, the lower auxiliary electrode layer BML, the active layer ACT, and the transistor electrode layer TL, which are described above with reference to FIG. 7, are illustrated. For example, in FIG. 9, layers (e.g., an anode connection electrode 1200, a cathode connection electrode 1400) included in the lower auxiliary electrode layer BML are illustrated as hatching of the lower auxiliary electrode layer BML shown in FIG. 7. In FIG. 9, layers included in the active layer ACT are illustrated by thick lines in the transistors M1, M2, M3. In FIG. 9, layers (e.g., second scan line SL2) included in the transistor electrode layer TL are illustrated as hatching of the transistor electrode layer TL shown in FIG. 7. In FIG. 9, first and second contact parts CNT1 and CNT2 are illustrated as a box with "X" in it. Also, in FIG. 9, contact holes for electrically connecting different electrode patterns (e.g., the lower auxiliary electrode layer BML and the transistor electrode layer TL) are indicated in a quadrangular shape.

In FIG. 10, the alignment electrode layer ELT and the contact electrode layer CNE, which are described above with reference to FIG. 7, are illustrated. Also, in FIG. 10, the bank BNK is further illustrated. Similarly, in FIG. 10, first and second contact parts CNT1 and CNT2 are illustrated as a box with "X" in it. In some embodiments, the first contact part CNT1 may be provided in plurality. For example, each of the first contact parts CNT1 may correspond to one of sub-pixels SPX.

In accordance with an embodiment, pixel circuits PXC and lines connected to the pixel circuits PXC may be included and disposed in the pixel PXL.

The pixel circuits PXC may include a first pixel circuit PXC1, a second pixel circuit PXC2, and a third pixel circuit PXC3. Each of the first pixel circuit PXC1, the second pixel circuit PXC2, and the third pixel circuit PXC3 may include a first transistor M1, a second transistor M2, a third transistor M3, and a storage capacitor Cst.

The pixel circuits PXC may be disposed adjacent to each other in the first direction DR1. For example, the first pixel circuit PXC1, the second pixel circuit PXC2, and the third pixel circuit PXC3 may be disposed adjacent to each other in the first direction DR1.

In accordance with an embodiment, the direction in which the pixel circuits PXC are disposed adjacent to each other may be different from a direction in which the first contact parts CNT1 are arranged. For example, the first pixel circuit PXC1, the second pixel circuit PXC2, and the third pixel circuit PXC3 may be disposed adjacent to each other in the first direction DR1 different from the second direction DR2 in which the first contact parts CNT1 of the first pixel circuit PXC1, the second pixel circuit PXC2, and the third pixel circuit PXC3 are arranged.

In accordance with an embodiment, the first contact parts CNT1 may overlap with the pixel circuits PXC along the direction in which the pixel circuits PXC are disposed adjacent to each other. For example, the first contact parts CNT1 may overlap with the first pixel circuit PXC1 and the second pixel circuit PXC2 along the first direction DR1 in which the first pixel circuit PXC1 and the second pixel circuit PXC2 are disposed adjacent to each other.

In accordance with an embodiment, a direction in which first to third sub-pixels SPX1, SPX2, and SPX3 are disposed adjacent to each other may be equal (or correspond) to the direction in which the first contact parts CNT1 are arranged. The first to third sub-pixels SPX1, SPX2, and SPX3 may be disposed adjacent to each other in the first direction DR1 different from the second direction DR2 in which the first contact parts CNT1 are arranged.

A first scan line SL1 may extend in the first direction DR1. A second scan line SL2 may extend in the second direction DR2. The first scan line SL1 may be electrically connected to the second scan line SL2 through a contact member CP (refer to FIG. 5). The second scan line SL2 may include a branch line extending in a second direction, and the extending branch line may be disposed adjacent to the pixel circuits PXC.

Data lines DL may extend in the first direction DR1. The data lines DL may be spaced apart from each other in the second direction DR2. The data lines DL may include a first data line DL1, a second data line DL2, and a third data line DL3. In accordance with an embodiment, the direction in which the data lines DL extend may be different from the direction in which the first contact parts CNT1 are arranged. For example, the first data line DL1, the second data line DL2, and the third data line DL3 may extend in the first direction DR1 different from the second direction DR2 in which the contact parts CNT1 are arranged.

The first data line DL1 may mean a data line DL for the first pixel circuit PXC1 of the first sub-pixel SPX1. The second data line DL2 may mean a data line DL for the second pixel circuit PXC2 of the second sub-pixel SPX2. The third data line DL3 may mean a data line DL for the third pixel circuit PXC3 of the third sub-pixel SPX3.

A sensing line SENL may extend in the first direction DR1. In accordance with an embodiment, the sensing line SENL may extend in the first direction DR1 different from the second direction DR2 in which the first contact parts CNT1 are arranged.

A first power line VDD may extend in the first direction DR1. A second power line VSS may include a (2_H)th power line VSS_H extending in the second direction DR2 and a (2_V)th power line VSS_V extending in the first direction DR1.

The second power line VSS (e.g., the (2_H)th power line VSS_H) may be electrically connected to the alignment electrode layer ELT (e.g., a second electrode ELT2) through a contact hole CH.

The second power line VSS (e.g., the (2_H)th power line VSS_H) may be electrically connected to a cathode connection electrode 1400 through a contact hole, and the cathode connection electrode 1400 may be electrically connected to the contact electrode layer CNE through the second contact part CNT2.

The pixel PXL may further include an anode connection electrode 1200. The anode connection electrode 1200 may be electrically connected to an anode electrode AE through the first contact part CNT1. For example, the anode connection electrode 1200 may be electrically connected to a first contact electrode CNE1 through the first contact part CNT1. The anode connection electrode 1200 and the first contact part CNT1 will be described in detail later with reference to FIG. 13.

The pixel PXL may further include the cathode connection electrode 1400. The cathode connection electrode 1400 may be electrically connected to a cathode electrode CE through the second contact part CNT2. For example, the cathode connection electrode 1400 may be electrically connected to a fifth contact electrode CNE5 through the second contact part CNT2. This will be described in detail with reference to FIG. 11.

The first contact parts CNT1 may be electrically connected to the anode connection electrode 1200 of each sub-pixel SPX. The first contact parts CNT1 may be arranged (or disposed) along a direction (e.g., an arrangement direction). The first contact parts CNT1 may be disposed in parallel along the direction. The first contact parts CNT1 may be aligned along the second direction DR2.

The first contact parts CNT1 may be disposed adjacent to one side of the sub-pixels SPX. The first contact parts CNT1 may be disposed adjacent to each other along the second direction. Accordingly, the first contact parts CNT1 are not sporadically disposed but may be disposed adjacent to each other. For example, the first contact parts CNT1 may be arranged along the second direction in a non-emission area NEA disposed between pixels PXL.

The first contact parts CNT1 may be disposed in the non-emission area NEA. For example, in a plan view, the first contact parts CNT1 may overlap with the non-emission area NEA, and may not overlap with an emission area EMA.

The first contact parts CNT1 may be spaced apart from an area in which the pixel circuits PXC are disposed. Also, in some embodiments, the first contact parts CNT1 may be spaced apart from emission areas EMA through which lights of the sub-pixels SPX are emitted.

The first contact parts CNT1 may be arranged along the second direction DR2 between the (2_H)th power line VSS_H and the second scan line SL2. The first contact parts CNT1 may be disposed between the first power line VDD and the sensing line SENL.

In accordance with an embodiment, the first contact parts CNT1 may be disposed outside of an area in which light emitting elements LD are aligned to be spaced apart from the area in which the light emitting elements LD are aligned. Accordingly, the area in which the light emitting elements LD are aligned can be sufficiently secured.

In accordance with an embodiment, the first contact parts CNT1 may not overlap with at least one of the emission areas EMA of the sub-pixels SPX along the first direction DR1. For example, the first contact parts CNT1 overlaps with the emission areas EMA of the first sub-pixel SPX1 and the second sub-pixel SPX2 along the first direction DR1, and may not overlap with the emission area of the third sub-pixel SPX3. That is, the area in which the first contact parts CNT1 are disposed is locally formed, so that the area in which the light emitting elements LD are disposed can be sufficiently secured.

The alignment electrode layer ELT may include a first electrode ELT1, a second electrode ELT2, and a third electrode ELT3. The first electrode ELT1, the second electrode ELT2, and the third electrode ELT3 may extend in the first direction DR1, and be spaced apart from each other along the second direction DR2.

In accordance with an embodiment, the direction in which first electrode ELT1, the second electrode ELT2, and the third electrode ELT3 extend may be different from the direction in which the first contact parts CNT1 are arranged. For example, the first electrode ELT1, the second electrode ELT2, and the third electrode ELT3 may extend in the first direction DR1 different from the second direction DR2 in which the first contact parts CNT1 are arranged.

The contact electrode layer CNE may include a plurality of contact electrodes and each of the plurality of contact electrodes may extend in a predetermined direction.

For convenience of description, a connection structure of light emitting elements LD including the alignment electrode layer ELT and the contact electrode layer CNE will be described with reference to FIGS. 11 and 12.

FIG. 11 is a schematic plan view illustrating a pixel in accordance with an embodiment of the present disclosure. In FIG. 11, a single pixel PXL including first to third sub-pixels SPX1, SPX2, and SPX3 is briefly illustrated. For convenience of description, the anode connection electrode 1200 and the cathode connection electrode 1400, which are described above, are not shown in FIG. 11.

Figure 12:
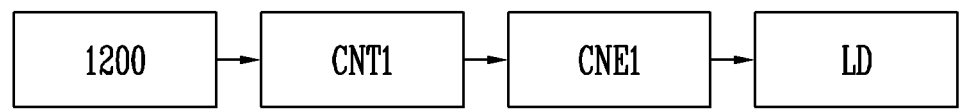
FIG. 12 is a block diagram illustrating a path through which an anode signal is supplied to a light emitting element in accordance with an embodiment of the present disclosure.

FIG. 12 is a block diagram illustrating a path through which the anode signal is supplied to a light emitting element in accordance with an embodiment of the present disclosure.

Referring to FIGS. 11 and 12, the anode connection electrode 1200 may be electrically connected to the first contact electrode CNE1 through the first contact part CNT1. In addition, the first contact electrode CNE1 may be electrically connected to a light emitting element LD. That is, an anode signal provided from the anode connection electrode 1200 may be provided (or supplied) to the light emitting element LD through the first contact part CNT1 and the first contact electrode CNE1.

Each of the first to third sub-pixels SPX1, SPX2, and SPX3 may include a plurality of light emitting units. For example, each of the first to third sub-pixels SPX1, SPX2, and SPX3 may include first to fourth light emitting units EMU1 to EMU4. In accordance with an embodiment, light emitting elements LD of the first light emitting unit EMU1, light emitting elements LD of the second light emitting unit EMU2, light emitting elements LD of the third light emitting unit EMU3, and light emitting elements LD of the fourth light emitting unit EMU4 may be sequentially electrically connected to each other.

The light emitting elements LD of the first light emitting unit EMU1 and the second light emitting unit EMU2 may be disposed between the first electrode ELT1 and the second electrode ELT2. The light emitting elements LD of the third light emitting unit EMU3 and the fourth light emitting unit EMU4 may be disposed between the second electrode ELT2 and the third electrode ELT3. That is, in order to align the light emitting elements LD, after the light emitting elements LD are dispersed onto the alignment electrode layer ELT, an electric field may be formed between the first electrode ELT1 and the second electrode ELT2, and an electric field may be formed between the second electrode ELT2 and the third electrode ELT3. Accordingly, the light emitting elements LD can be aligned between the first electrode ELT1 and the second electrode ELT and between the second electrode ELT2 and the third electrode ELT3.

The contact electrode layer CNE may include first to fifth contact electrodes CNE1 to CNE5. The first to fifth contact electrodes CNE1 to CNE5 may be defined in each of the first to third sub-pixels SPX1, SPX2, and SPX3.

The first contact parts CNT1 may include a (1_1)th contact part CNT1_1, a (1_2)th contact part CNT1_2, and a (1_3)th contact part CNT1_3.

For example, a first contact electrode CNE1 of the first sub-pixel SPX may be electrically connected to the anode connection electrode 1200 of the first sub-pixel SPX1 through the (1_1)th contact part CNT1_1. The (1_1)th contact part CNT1_1 may be a path through which the anode signal is provided to the light emitting element of the first sub-pixel SPX1.

A first contact electrode CNE1 of the second sub-pixel SPX2 may be electrically connected to the anode connection electrode 1200 of the second sub-pixel SPX2 through the (1_2)th contact part CNT1_2. The (1_2)th contact part CNT1_2 may be a path through which the anode signal is provided to the light emitting element LD of the second sub-pixel SPX2.

A first contact electrode CNE1 of the third sub-pixel SPX3 may be electrically connected to the anode connection electrode 1200 of the third sub-pixel SPX3 through the (1_3)th contact part CNT1_3. The (1_3)th contact part CNT1_3 may be a path through which the anode signal is provided to the light emitting element LD of the third sub-pixel SPX3.

A fifth contact electrode CNE5 of each of the first to third sub-pixels SPX1 to SPX3 may be electrically connected to the cathode connection electrode 1400 through the second contact part CNT2.

A first end portion EP1 of the light emitting element LD of the first light emitting unit EMU1 may be electrically connected to the first contact electrode CNE1. The light emitting element LD of the first light emitting unit EMU1 may be receive the anode signal provided from the first contact electrode CNE1.

A second end portion EP2 of the light emitting element LD of the first light emitting unit EMU1 may be electrically connected to a second contact electrode CNE2. The light emitting element LD of the first light emitting unit EMU1 may receive the cathode signal provided from the second contact electrode CNE2.

A first end portion EP1 of the light emitting element LD of the second light emitting unit EMU2 may be electrically connected to the second contact electrode CNE2. The light emitting element LD of the second light emitting unit EMU2 may receive the anode signal provided from the second contact electrode CNE2.

A second end portion EP2 of the light emitting element LD of the second light emitting unit EMU2 may be electrically connected to a third contact electrode CNE3. The light emitting element LD of the second light emitting unit EMU2 may receive the cathode signal provided from the third contact electrode CNE3.

A first end portion EP1 of the light emitting element LD of the third light emitting unit EMU3 may be electrically connected to the third contact electrode CNE3. The light emitting element LD of the third light emitting unit EMU3 may receive the anode signal provided from the third contact electrode CNE3.

A second end portion EP2 of the light emitting element LD of the third light emitting unit EMU3 may be electrically connected to a fourth contact electrode CNE4. The light emitting element LD of the third light emitting unit EMU3 may receive the cathode signal provided from the fourth contact electrode CNE4.

A first end portion EP1 of the light emitting element LD of the fourth light emitting unit EMU4 may be electrically connected to the fourth contact electrode CNE4. The light emitting element LD of the fourth light emitting unit EMU4 may receive the anode signal provided from the fourth contact electrode CNE4.

A second end portion EP2 of the light emitting element LD of the fourth light emitting unit EMU4 may be electrically connected to a fifth contact electrode CNE5. The light emitting element LD of the fourth light emitting unit EMU4 may receive the cathode signal provided from the fifth contact electrode CNE5.

The fifth contact electrode CNE5 may be electrically connected to the second contact part CNT2, to receive the cathode signal. A portion of the fifth contact electrode CNE5 may be electrically connected to the light emitting element LD of the fourth light emitting unit EMU4 of each of the first to third sub-pixels SPX1 to SPX3.

Meanwhile, the first contact parts CNT1 may be arranged along a direction as described above. For example, the (1_1)th contact part CNT1_1, the (1_2)th contact part CNT1_2, and the (1_3)th contact part CNT1_3 may be arranged along the second direction DR2. Accordingly, an area in which the light emitting units EMU of the first to third sub-pixels SPX1 to SPX3 can be disposed may be sufficiently secured. In particular, a length of the emission area EMA in which the light emitting units EMU are disposed in the first direction DR1 can be sufficiently secured. Consequently, the light emission efficiency of the pixel PXL can be improved.

Hereinafter, a sectional structure of the sub-pixel SPX will be described with reference to FIG. 13. FIG. 13 is a schematic sectional view taken along line I-I' shown in FIG. 11. FIG. 13 may illustrate a sectional structure of the first sub-pixel SPX1 in accordance with an embodiment of the present disclosure. For convenience of description, the first sub-pixel SPX1 is designated as a sub-pixel SPX, and technical features of the sub-pixel SPX are described. In FIG. 13, descriptions of portions overlapping with those described above will be omitted or simplified.

Referring to FIG. 13, the sub-pixel SPX may include a substrate SUB, a pixel circuit layer PCL, and a display element layer DPL.

The substrate SUB may be provided as a base surface such that the pixel circuit layer PCL and the display element layer DPL are disposed on the substrate SUB.

The pixel circuit layer PCL may be disposed on the substrate SUB. The pixel circuit layer PCL may include a lower auxiliary electrode layer BML, a buffer layer BFL, a pixel circuit PXC, a gate insulating layer GI, an interlayer insulating layer ILD, a bridge pattern BRP, a protective layer PSV, a first contact part CNT1, and a contact hole CH. For convenience of description, a first transistor M1 included in the pixel circuit PXC is mainly illustrated in FIG. 13.

The lower auxiliary electrode layer BML may be disposed on the substrate SUB. In accordance with an embodiment, the lower auxiliary electrode layer BML may include an anode connection electrode 1200, a power connection electrode 1300, and a transistor connection electrode 1600. Although not shown in FIG. 13, the lower auxiliary electrode layer BML may further include a cathode connection electrode 1400.

The anode connection electrode 1200 may be disposed on the substrate SUB to be electrically connected to the first transistor M1 (e.g., a first transistor electrode TE1). The anode connection electrode 1200 may be electrically connected to a first contact electrode CNE1 through the first contact part CNT1.

The power connection electrode 1300 may be disposed on the substrate SUB to be electrically connected to the bridge pattern BRP. The power connection electrode 1300 may provide a second alignment signal to a second electrode ELT2 such that a light emitting element LD is aligned on a first electrode ELT1 and the second electrode ELT2. The second alignment signal may be provided to the second electrode ELT2 through the bridge pattern BRP.

The transistor connection electrode 1600 may be disposed on the substrate SUB to be electrically connected to the first transistor M1 (e.g., a second transistor electrode TE2). The transistor connection electrode 1600 may be electrically connected to a first power line VDD.

The buffer layer BFL may be disposed on the substrate SUB on the lower auxiliary electrode layer BML. The buffer layer BFL may prevent an impurity from being diffused from the outside.

The first transistor M1 may be a thin film transistor. In some embodiments, the first transistor M1 may be a driving transistor.

The first transistor M1 may be electrically connected to the light emitting element LD. The first transistor M1 may be electrically connected to the light emitting element LD through the anode connection electrode 1200 and the first contact electrode CNE1 (e.g., an anode electrode AE).

The first transistor M1 may include an active layer ACT, the first transistor electrode TE1, the second transistor electrode TE2, and a gate electrode GE.

The active layer ACT may mean a semiconductor layer. The active layer ACT may be disposed on the buffer layer BFL.

The active layer ACT may include a first contact region in contact with the first transistor electrode TE1 and a second contact region in contact with the second transistor electrode TE2. The first contact region and the second contact region may correspond to a semiconductor pattern doped with an impurity. A region between the first contact region and the second contact region may be a channel region. The channel region may correspond to an intrinsic semiconductor pattern undoped with the impurity. In an example, the first transistor electrode TE1 may be a drain electrode, and the second transistor electrode TE2 may be a source electrode. However, the present disclosure is not limited thereto.

The gate electrode GE may be disposed on the gate insulating layer GI. A position of the gate electrode GE may correspond to a position of the channel region of the active layer ACT. For example, the gate electrode GE may be disposed on the channel region of the active layer ACT with the gate insulating layer GI interposed therebetween.

In accordance with an embodiment, the first transistor electrode TE1, the second transistor electrode TE2, and the gate electrode GE may be disposed in the same plane to form a transistor electrode layer TL. However, the present disclosure is not limited thereto. For example, the first transistor electrode TE1 and the second transistor electrode TE2 may be disposed in a plane (e.g., an interlayer conductive layer ICL) different from a plane in which the gate electrode GE is disposed.

The gate insulating layer GI may be disposed on the buffer layer BFL. The gate insulating layer GI may cover the active layer ACT.

The interlayer insulating layer ILD may be disposed on the gate insulating layer GI. The interlayer insulating layer ILD may cover the transistor electrode layer TL (e.g., the first and second transistor electrodes TE1 and TE2 and the gate electrode GE).

The bridge pattern BRP may be disposed on the gate insulating layer GI. The bridge pattern BRP may be disposed in the same plane as the transistor electrode layer TL. However, in some embodiments, the bridge pattern BRP may be disposed in the interlayer conductive layer ICL. The bridge pattern BRP may be electrically connected to the power connection electrode 1300, and be electrically connected to the second electrode ELT2 through the contact hole CH.

The protective layer PSV may be disposed on the interlayer insulating layer ILD.

The contact hole CH may be formed through the protective layer PSV and the interlayer insulating layer ILD.

The display element layer DPL may be disposed on the pixel circuit layer PCL. The display element layer DPL may include first and second insulating patterns INP1 and INP2, the first electrode ELT1, the second electrode ELT2, a third electrode ELT3, a first insulating layer INS1, a bank BNK, the light emitting element LD, a second insulating layer INS2, the first contact electrode CNE1, a second contact electrode CNE2, and a third insulating layer INS3.

The first insulating pattern INP1 and the second insulating pattern INP2 may protrude in a thickness direction of the substrate SUB (e.g., the third direction DR3). The first insulating pattern INP1 and the second insulating pattern INP2 may be arranged in a form in which the first insulating pattern INP1 and the second insulating pattern INP2 surround an area in which the light emitting element LD is disposed, in a plan view. The first insulating pattern INP1 and the second insulating pattern INP2 may include an organic material or an inorganic material.

The first electrode ELT1 and the second electrode ELT2 may be disposed on the first insulating pattern INP1 and the second insulating pattern INP2, to form a reflective wall. Accordingly, the light emission efficiency of the sub-pixel SPX can be improved.

The first electrode ELT1 and the second electrode ELT2 may be disposed on the protective layer PSV. In some embodiments, portions of the first electrode ELT1 and the second electrode ELT2 may be respectively disposed on the first insulating pattern INP1 and the second insulating pattern INP2. The second electrode ELT2 may be electrically connected to the bridge pattern BRP through the contact hole CH.

The first electrode ELT1 and the second electrode ELT2 may be alignment electrodes for the light emitting element LD. As described above, a first alignment signal is provided to the first electrode ELT1 and a second alignment signal is provided to the second electrode ELT2. Therefore, an electric field may be formed between the first electrode ELT1 and the second electrode ELT2, and the light emitting element LD may be arranged based on the formed electric field. For example, a first end portion EP1 of the light emitting element LD may face the first electrode ELT1 and a second end portion EP2 of the light emitting element LD may face the second electrode ELT2.

The first insulating layer INS1 may be disposed on the protective layer PSV. The first insulating layer INS1 may cover the first electrode ELT1, the second electrode ELT2, and the third electrode ELT3. The first insulating layer INS1 may stabilize connection between electrode components, and reduce external influence. The first insulating layer INS1 may include any one of silicon nitride ($SiN_x$), silicon oxide ($SiO_x$), silicon oxynitride ($SiO_xN_y$), and aluminum oxide ($AlO_x$). However, the present disclosure is not limited thereto.

The bank BNK may be disposed on the first insulating layer INS1. The bank BNK may protrude in the thickness direction of the substrate SUB (e.g., the third direction DR3). The light emitting element LD may be disposed between adjacent banks BNK.

The light emitting element LD may be disposed on the first insulating layer INS1. The light emitting element LD may emit light based on an electrical signal provided from the first contact electrode CNE1 and the second contact electrode CNE2. As described above, the light emitting element LD may arranged based on an electric field formed between the first electrode ELT1 and the second electrode ELT2. In some embodiments, the light emitting element LD may be arranged by an external force (e.g., a dielectrophoretic (DEP) force) according to the electric field.

The second insulating layer INS2 may be disposed on the light emitting element LD. The second insulating layer INS2 may cover an active layer AL of the light emitting element LD. In an example, the second insulating layer INS2 may include at least one of an organic material and an inorganic material.

The first contact part CNT1 may be formed through the buffer layer BFL, the gate insulating layer GI, the interlayer insulating layer ILD, the protective layer PSV, and the first insulating layer INS1. Although not shown in the drawing, a second contact part CNT2 may also be formed through the buffer layer BFL, the gate insulating layer GI, the interlayer insulating layer ILD, the protective layer PSV, and the first insulating layer INS1.

The first contact electrode CNE1 and the second contact electrode CNE2 may be disposed on the first insulating layer INS1 on the bank BNK. As described above, the first contact electrode CNE1 may be the anode electrode AE for the light emitting element LD, and the second contact electrode CNE2 may be a cathode electrode CE for the light emitting element LD. The first contact electrode CNE1 may be electrically connected to the anode connection electrode 1200 through the first contact part CNT1. In accordance with an embodiment, the first contact part CNT1 may be disposed between the substrate SUB and the display element layer DPL.

In some embodiments, the first contact electrode CNE1 and the second contact electrode CNE2 may be disposed in the same layer. That is, the first contact electrode CNE1 and the second contact electrode CNE2 may be patterned through the same process. However, in some embodiments, the first contact electrode CNE1 and the second contact electrode CNE2 may be patterned through different processes. An additional insulating layer may be interposed between the first contact electrode CNE1 and the second contact electrode CNE2, so that a short-circuit defect between the first contact electrode CNE1 and the second contact electrode CNE2 can be prevented.

The third insulating layer INS3 may be disposed on the first contact electrode CNE1, the second contact electrode CNE2, and the second insulating layer INS2. The third insulating layer INS3 may be disposed at an outer portion to protect components of the display element layer DPL from external influence. In some embodiments, the third insulating layer INS3 may include one of silicon nitride ($SiN_x$), silicon oxide ($SiO_x$), silicon oxynitride ($SiO_xN_y$), and aluminum oxide ($AlO_x$). However, the present disclosure is not limited to the above-described example.

Figure 14:
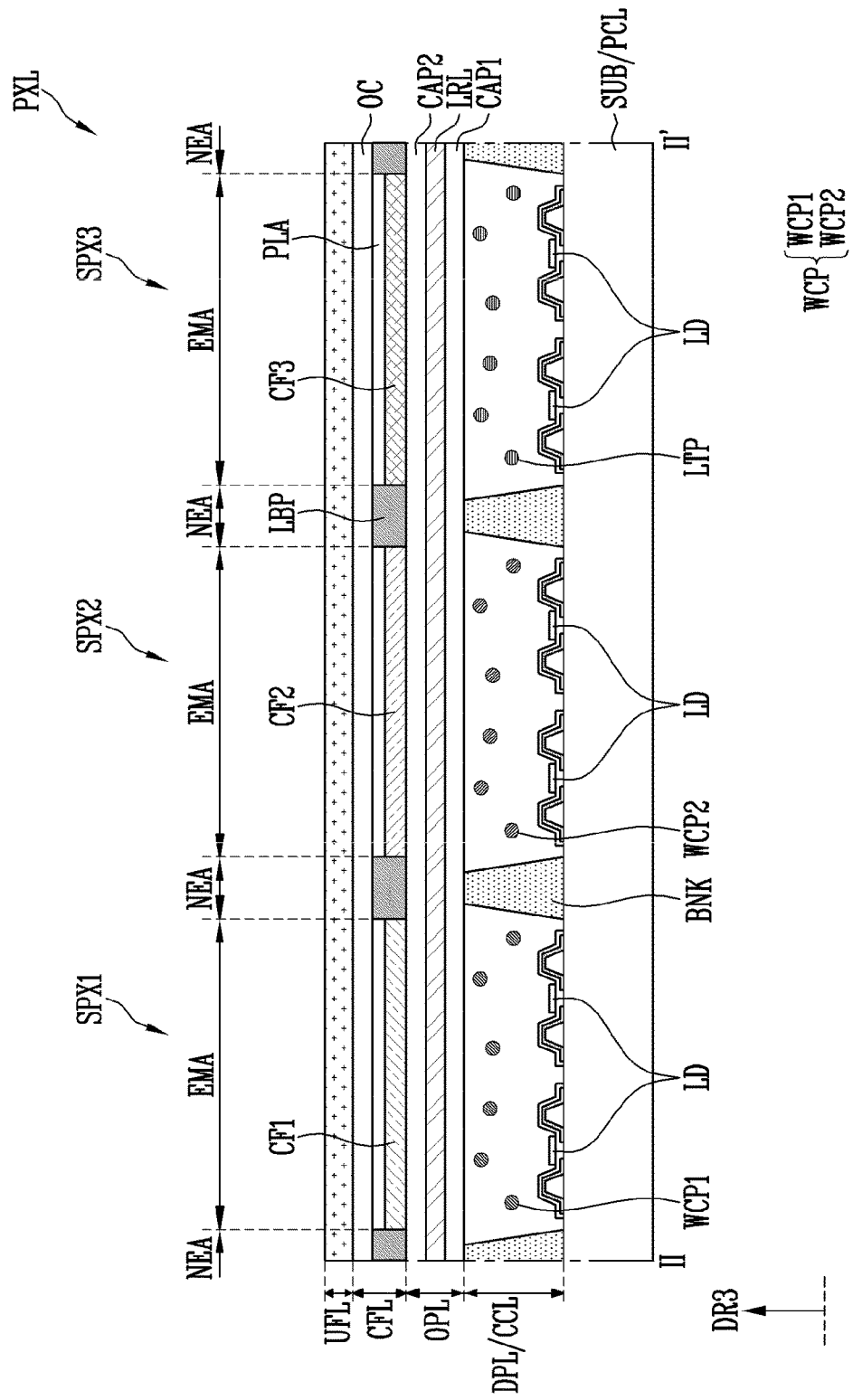
FIG. 14 is a schematic sectional view taken along line II-II' shown in FIG. 11.

Hereinafter, an additional structure including a color conversion layer CCL of the pixel PXL will be described with reference to FIG. 14. FIG. 14 is a schematic sectional view taken along line II-II' shown in FIG. 11. In FIG. 14, individual components of the pixel circuit layer PCL and the display element layer DPL are briefly illustrated.

In accordance with an embodiment, light emitting elements LD disposed in each of the first sub-pixel SPX1, the second sub-pixel SPX2, and the third sub-pixel SPX3 may emit light of the same color. For example, the first sub-pixel SPX1, the second sub-pixel SPX2, and the third sub-pixel SPX3 may include light emitting elements LD emitting light of a third color, e.g., blue light. The color conversion layer CCL and/or a color filter layer CFL may be provided in the first sub-pixel SPX1, the second sub-pixel SPX2, and the third sub-pixel SPX3 to display a full-color image. However, the present disclosure is not necessarily limited thereto, and the first sub-pixel SPX1, the second sub-pixel SPX2, and the third sub-pixel SPX3 may include light emitting elements LD emitting lights of different colors.

The color conversion layer CCL may be disposed in the display element layer DPL. For example, the color conversion layer CCL may be disposed between banks BNK. In some embodiments, an additional bank may be further disposed on the bank BNK. When the additional bank is disposed, a bank structure further protruding in the third direction DR3 may be formed, so that an area in which the color conversion layer CCL can be disposed can be clearly defined. The color conversion layer CCL may be disposed between additional banks.

The color conversion layer CCL may be configured to change a wavelength of light. For example, the color conversion layer CCL may include a wavelength conversion particle WCP and a light transmission particle LTP. In an example, the wavelength conversion particle WCP may include a first wavelength conversion particle WCP1 and a second wavelength conversion particle WCP2.

The first wavelength conversion particle WCP1 may be disposed to overlap with an emission area EMA of the first sub-pixel SPX1. For example, the first wavelength conversion particle WCP1 may be provided between banks BNK to overlap with the emission area EMA of the first sub-pixel SPX1 in a plan view.

The second wavelength conversion particle WCP2 may be disposed to overlap with an emission area EMA of the second sub-pixel SPX2. For example, the second wavelength conversion particle WCP2 may be provided between banks BNK to overlap with the emission area EMA of the second sub-pixel SPX2 in a plan view.

The light transmission particle LTP may be disposed to overlap with an emission area EMA of the third sub-pixel SPX3. For example, the light transmission particle LTP may be provided between banks BNK, to overlap with the emission area EMA of the third sub-pixel SPX3 in a plan view.

In accordance with an embodiment, the first wave conversion particle WCP1 may include first color conversion particles for converting light of the third color, which is emitted from a light emitting element LD, into light of a first color. For example, when the light emitting element LD is a blue light emitting element emitting light of blue, and the first sub-pixel SPX1 is a red pixel, the first wavelength conversion particle WCP1 may include a first quantum dot for converting light of blue, which is emitted from the blue light emitting element, into light of red.

For example, the first wavelength conversion particle WCP1 may include a plurality of first quantum dots dispersed in a predetermined matrix material such as base resin. The first quantum dot may absorb blue light and emit red light by shifting a wavelength of the blue light according to energy transition. Meanwhile, when the first sub-pixel SPX1 is a pixel of another color, the first wavelength conversion particle WCP1 may include a first quantum dot corresponding to the color of the first sub-pixel SPX1.

In accordance with an embodiment, the second wavelength conversion particle WCP2 may include second color conversion particles for converting light of the third color, which is emitted from the light emitting element LD, into light of a second color. In an example, when the light emitting element LD is a blue light emitting element emitting light of blue, and the second sub-pixel SPX2 is a green pixel, the second wavelength conversion particle WCP2 may include a second quantum dot for converting light of blue, which is emitted from the blue light emitting element, into light of green.

For example, the second wavelength conversion particle WCP2 may include a plurality of second quantum dots dispersed in a predetermined matrix material such as base resin. The second quantum dot may absorb blue light and emit green light by shifting a wavelength of the blue light according to energy transition. Meanwhile, when the second sub-pixel SPX2 is a pixel of another color, the second wavelength conversion pattern WCP2 may include a second quantum dot corresponding to the color of the second sub-pixel SPX2.

Meanwhile, the first quantum dot and the second quantum dot may have shape such as a spherical shape, a pyramid shape, a multi-arm shape, a cubic nano particle, a nano wire, a nano fabric, or a nano plate particle. However, the present disclosure is not necessarily limited thereto, and the shape of the first quantum dot and the second quantum dot may be variously changed.

In an embodiment, light of blue having a relatively short wavelength in a visible light band is incident into the first quantum dot and the second quantum dot, so that absorption coefficients of the first quantum dot and the second quantum dot can be increased. Accordingly, the efficiency of light finally emitted from the first sub-pixel SPX1 and the second sub-pixel SPX2 can be improved, and excellent color reproduction can be ensured. In addition, the pixel unit of the first to third sub-pixels SPX1, SPX2, and SPX3 is configured by using light emitting elements LD of the same color (e.g., blue light emitting elements), so that the manufacturing efficiency of the display device can be improved.

In accordance with an embodiment, the light transmission particle LTP may be provided to efficiently use light of the third color emitted from the light emitting element LD. For example, when the light emitting element LD is a blue light emitting element emitting light of blue, and the third sub-pixel SPX3 is a blue pixel, the light transmission particle LTP may include at least one kind of light scattering particles to efficiently use light emitted from the light emitting element LD.

For example, the light transmission particle LTP may include a plurality of light scattering particles dispersed in a predetermined matrix material such as base resin. In an example, the light transmission particle LTP may include light scattering particles such as silica, but the material constituting the light scattering particles is not limited thereto.

Meanwhile, the light scattering particles are not to be disposed in only the emission area EMA of the third sub-pixel SPX3. In an example, the light scattering particles may be scattered in the base resin for the first sub-pixel SPX1 and the second sub-pixel SPX2.

An optical layer OPL may include a first capping layer CAP1, a low refractive layer LRL, and a second capping layer CAP2. The optical layer OPL may be disposed on the color conversion layer CCL. The optical layer OPL may be disposed on the display element layer DPL.

The first capping layer CAP1 may seal (or cover) the wavelength conversion particle WCP and the light transmission particle LTP. The first capping layer CAP1 may be disposed between the low refractive layer LRL and the display element layer DPL. The first capping layer CAP1 may be provided throughout the first to third sub-pixels SPX1, SPX2, and SPX3. The first capping layer CAP1 may prevent the color conversion layer CCL from being damaged or contaminated due to infiltration of an impurity such as moisture or air from the outside.

In accordance with an embodiment, the first capping layer CAP1 may be configured as a single layer or a multi-layer including one insulating material among silicon oxide ($SiO_x$), silicon nitride ($SiN_x$), silicon oxynitride ($SiO_xN_y$), aluminum oxide ($AlO_x$), and titanium oxide ($TiO_x$). However, the present disclosure is not limited to the above-described example.

The low refractive layer LRL may be disposed between the first capping layer CAP1 and the second capping layer CAP2. The low refractive layer LRL may be disposed between the color conversion layer CCL and the color filter layer CFL. The low refractive layer LRL may be provided throughout the first to third sub-pixels SPX1, SPX2, and SPX3.

The low refractive layer LRL may function to allow light provided from the color conversion layer CCL to be recycled by total reflection, thereby improving light efficiency. To this end, the low refractive layer LRL may have a refractive index relatively lower than that of the color conversion layer CCL.

In accordance with an embodiment, the low refractive layer LRL may include a base resin and hollow particles dispersed in the base resin. The hollow particle may include a hollow silica particle. Alternatively, the hollow particle may be a pore formed by porogen, but the present disclosure is not necessarily limited thereto. Also, the low refractive layer LRL may include at least one of a zinc oxide (ZnO) particle, a titanium dioxide ($TiO_2$) particle, and a nano silicate particle, but the present disclosure is not necessarily limited thereto.

The second capping layer CAP2 may be disposed on the low refractive layer LRL. The second capping layer CAP2 may be disposed between the color filter layer CFL and the low refractive layer LRL. The second capping layer CAP2 may be provided throughout the first to third sub-pixels SPX1, SPX2, and SPX3. The second capping layer CAP2 may prevent the low refractive layer LRL from being damaged or contaminated due to infiltration of an impurity such as moisture or air from the outside.

In accordance with an embodiment, the second capping layer CAP2 may be configured as a single layer or a multi-layer including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$). However, the present disclosure is not limited to the above-described example.

The color filter layer CFL may be configured to allow light to be selectively transmitted therethrough. The color filter layer CFL may be disposed on the second capping layer CAP2. The color filter layer CFL may be provided throughout the first to third sub-pixels SPX1, SPX2, and SPX3. The color filter layer CFL may include color filters CF1, CF2, and CF3, a planarization layer PLA, a light blocking pattern LBP, and an overcoat layer OC.

In accordance with an embodiment, the color filters CF1, CF2, and CF3 may be disposed on the second capping layer CAP2. In a plan view, the color filters CF1, CF2, and CF3 may overlap with the emission areas EMA of the first to third sub-pixels SPX1, SPX2, and SPX3.

In accordance with an embodiment, a first color filter CF1 allows light of the first color to be transmitted therethrough, and may not allow light of the second color and light of the third color to be transmitted therethrough. In an example, the first color filter CF1 may include a colorant of the first color.

In accordance with an embodiment, a second color filter CF2 allows light of the second color to be transmitted therethrough, and may not allow light of the first color and light of the third color to be transmitted therethrough. In an example, the second color filter CF2 may include a colorant of the second color.

In accordance with an embodiment, a third color filter CF3 allows light of the third color to be transmitted therethrough, and may not allow light of the first color and light of the second color to be transmitted therethrough. In an example, the third color filter CF3 may include a colorant of the third color.

In accordance with an embodiment, the planarization layer PLA may be provided on the color filters CF1, CF2, and CF3. The planarization layer PLA may cover the color filters CF1, CF2, and CF3. The planarization layer PLA may planarize a step occurring due to the color filters CF1, CF2, and CF3. The planarization layer PLA may be provided throughout the first to third sub-pixels SPX1, SPX2, and SPX3.

In an example, the planarization layer PLA may include an organic material such as acrylic resin, epoxy resin, phenolic resin, polyamide resin, polyimide resin, unsaturated polyester resin, poly-phenylene ether resin, poly-phenylene sulfide resin, or benzocyclobutene (BCB). However, the present disclosure is not necessarily limited thereto, and the planarization layer PLA may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The light blocking pattern LBP may be disposed on the second capping layer CAP2 to partition the first to third color filters CF1, CF2, and CF3. In accordance with an embodiment, the light blocking pattern LBP may overlap with the bank BNK in a plan view. In a plan view, the light blocking pattern LBP may not overlap with the emission area EMA, and may overlap with the non-emission area NEA.

The light blocking pattern LBP may include a light blocking material, thereby preventing a light leakage defect in which light is leaked between adjacent sub-pixels SPX, and preventing a mixture of lights respectively emitted from adjacent sub-pixels SPX. For example, the light blocking pattern LBP may include a black matrix.

Meanwhile, in some embodiments, the first to third color filters CF1, CF2, and CF3 may be disposed while overlapping with an area in which the light blocking pattern LBP is disposed. Similarly, the first to third color filters CF1, CF2, and CF3 overlap with the area, thereby preventing the light leakage defect and preventing the mixture of lights.

The overcoat layer OC may be disposed on the planarization layer PLA. The overcoat layer OC may be disposed between an upper film layer UFL and the color filter layer CFL. The overcoat layer OC may be provided throughout the first to third sub-pixels SPX1, SPX2, and SPX3. The overcoat layer OC may cover a lower member including the color filter layer CFL. The overcoat layer OC may prevent moisture or air from infiltrating into the above-described lower member. Also, the overcoat layer OC may protect the above-described lower member from a foreign matter such as dust.

In accordance with an embodiment, the overcoat layer OC may include an organic material such as acrylic resin, epoxy resin, phenolic resin, polyamide resin, polyimide resin, unsaturated polyester resin, poly-phenylene ether resin, poly-phenylene sulfide resin, or benzocyclobutene (BCB). However, the present disclosure is not necessarily limited thereto, and the overcoat layer OC may include various kinds of inorganic insulating materials, including silicon oxide ($SiO_x$), silicon nitride ($SiN_x$), silicon oxynitride ($Si_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The upper film layer UFL may be disposed on the color filter layer UFL. The upper film layer UFL may be disposed at an outer portion of the display device 100 to decrease external influence on the display device 100. The upper film layer UFL may be provided throughout the first to third sub-pixels SPX1, SPX2, and SPX3.

In accordance with an embodiment, the upper film layer UFL may include an anti-reflective (AR) coating. The AR coating may mean a component formed by coating a material having an anti-reflection function on one surface of a specific component. The coated material may have a low reflexibility and properly include various materials known in the art.

Figure 15:
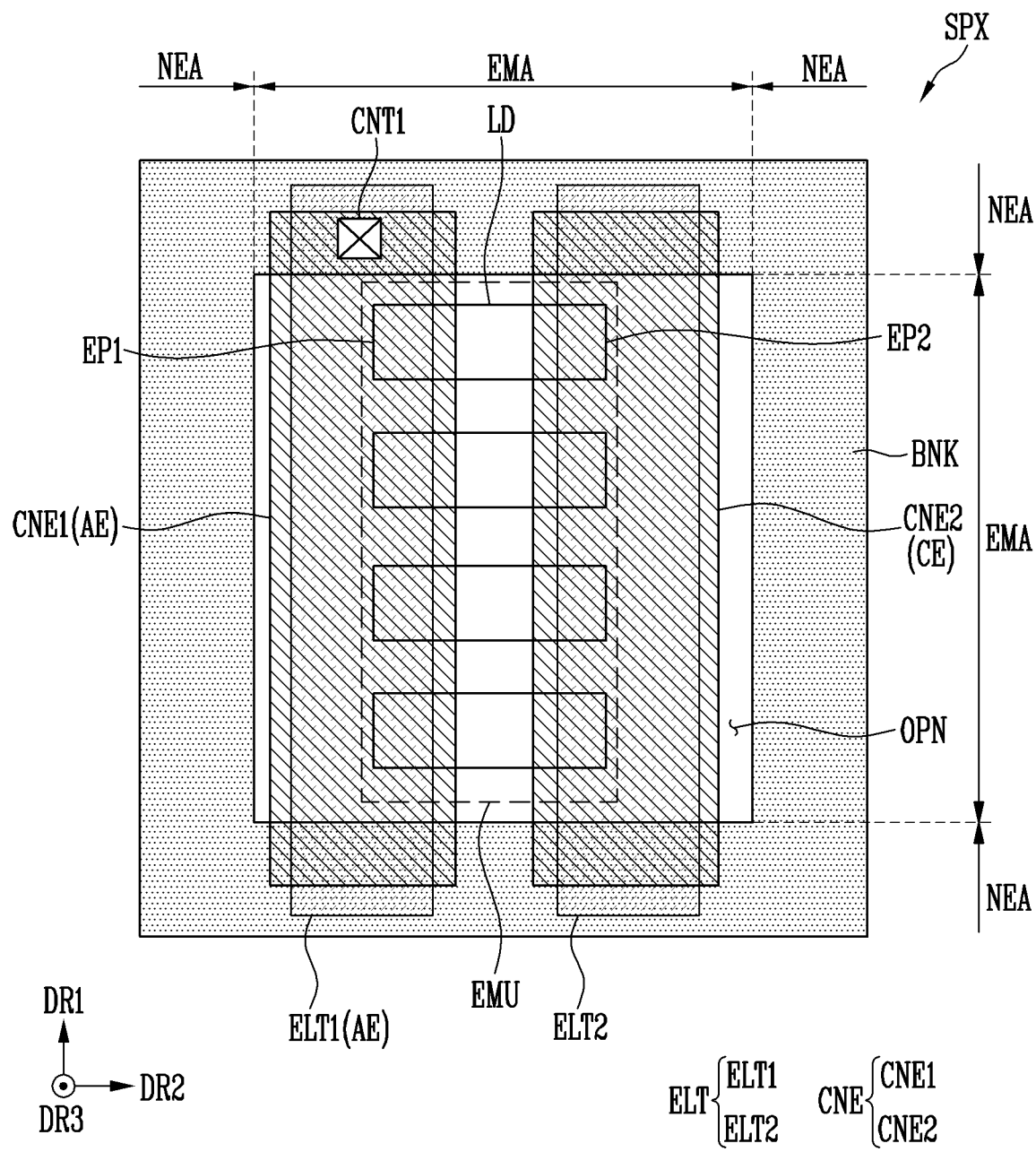
FIG. 15 is a schematic plan view illustrating a sub-pixel in accordance with another embodiment of the present disclosure.
Figure 16:
FIG. 16 is a block diagram illustrating a path through which an anode signal is supplied to a light emitting element in accordance with another embodiment of the present disclosure.
Figure 17:
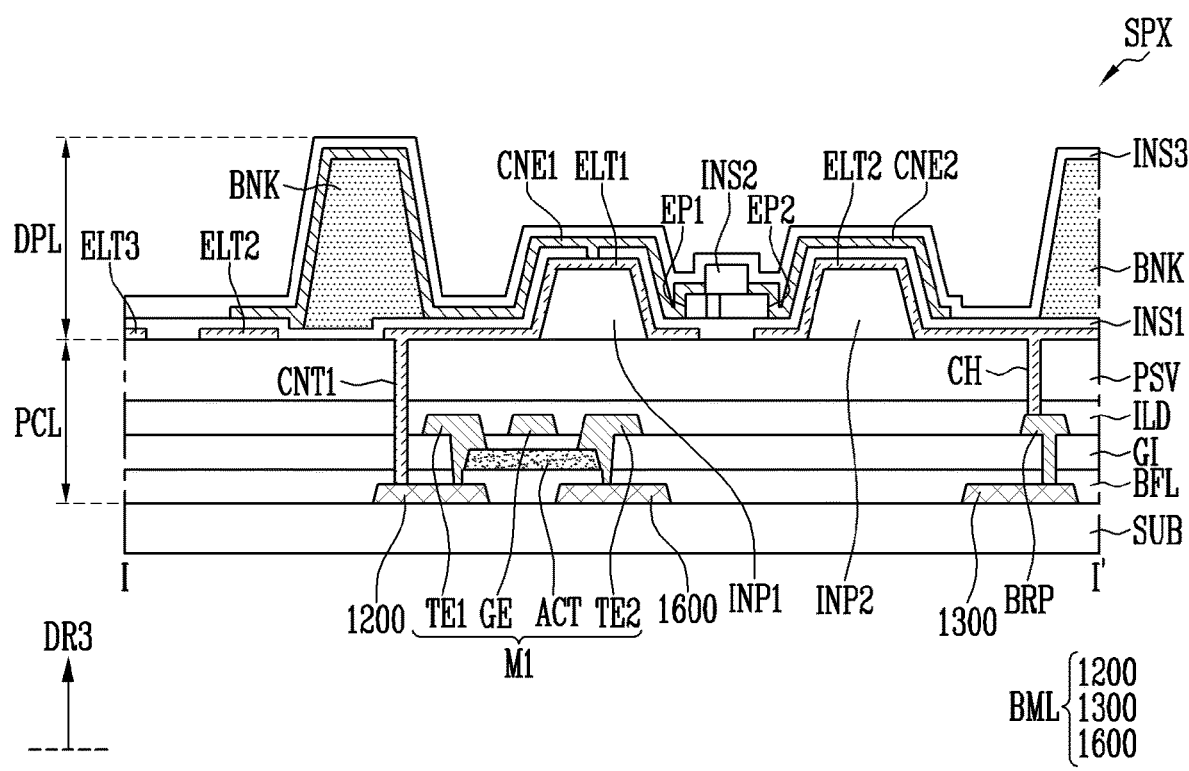
FIG. 17 is a schematic plan view illustrating a sub-pixel in accordance with another embodiment of the present disclosure.

Next, a pixel PXL in accordance with another embodiment of the present disclosure will be described with reference to FIGS. 15 to 17. In FIGS. 15 to 17, descriptions of portions overlapping with those described above will be simplified or omitted.

FIG. 15 is a schematic plan view illustrating a sub-pixel in accordance with another embodiment of the present disclosure.

FIG. 16 is a block diagram illustrating a path through which the anode signal is supplied to a light emitting element in accordance with another embodiment of the present disclosure.

FIG. 17 is a schematic plan view illustrating a sub-pixel in accordance with another embodiment of the present disclosure.

Referring to FIGS. 15 to 17, the pixel PXL in accordance with the another embodiment of the present disclosure is different from the pixel PXL in accordance with the embodiment of the present disclosure, in that the first electrode ELT1 is the anode electrode AE which provides the anode signal for allowing the light emitting element LD to emit light.

In accordance with an embodiment, the anode connection electrode 1200 may be electrically connected to the first electrode ELT1 through the first contact part CNT1. In addition, the first electrode ELT1 may be electrically connected to the light emitting element LD through the first contact electrode CNE1. That is, the anode signal provided from the anode connection electrode 1200 may be provided to the light emitting element LD through the first electrode ELT1 connected to the anode connection electrode 1200 through the first contact part CNT1, and the first contact electrode CNE1. Accordingly, in this embodiment, the first electrode ELT1 and the first contact electrode CNE1 constitute the anode electrode AE for the light emitting element LD.

In accordance with an embodiment, the anode connection electrode 1200 may be electrically connected to the first electrode ELT1 through the first contact part CNT1 formed through the buffer layer BFL, the gate insulating layer GI, the interlayer insulating layer ILD, and the protective layer PSV.

In accordance with the present disclosure, there can be provided a display device in which an area in which a light emitting element is disposed can be sufficiently secured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from features and scope of the present disclosure as set forth in the following claims.

What is claimed is:

1. A display device comprising:
a pixel including a first sub-pixel emitting light of a first color and a second sub-pixel emitting light of a second color,
wherein each of the first sub-pixel and the second sub-pixel includes:
a pixel circuit layer disposed on a substrate, the pixel circuit layer including a pixel circuit, and
a display element layer disposed on the pixel circuit layer, the display element layer including a light emitting element, an anode electrode, and a cathode electrode,
wherein the pixel circuit layer includes:
a first contact part disposed between the substrate and the display element layer, the anode electrode and the pixel circuit being connected to each other through the first contact part to supply an anode signal to the light emitting element,
wherein a plurality of first contact parts which include a first contact part in the first sub-pixel and a first contact part in the second sub-pixel are arranged along a first direction,
wherein the pixel circuit layer further includes an anode connection electrode disposed on the substrate,
wherein the anode electrode is electrically connected to a first end portion of the light emitting element, and the cathode electrode is electrically connected to a second end portion of the light emitting element,
wherein the anode connection electrode is electrically connected to the anode electrode through the first contact part,
wherein the pixel circuit includes:
a transistor, and
a storage capacitor,
wherein the transistor includes:
a first transistor electrode,
a second transistor electrode, and
a gate electrode, wherein the anode connection electrode is electrically connected to the first transistor electrode,
wherein the display element layer includes:
an alignment electrode including a first electrode and a second electrode disposed on the pixel circuit layer,
a first insulating layer disposed on the first electrode and the second electrode,
a first contact electrode disposed on the first insulating layer, and
a second contact electrode disposed on the first insulating layer,
wherein the first contact electrode is electrically connected to the anode connection electrode through the first contact part, and
wherein the first contact electrode is the anode electrode and the second contact electrode is the cathode electrode.

2. The display device of claim 1, wherein the pixel further includes a third sub-pixel emitting light of a third color and including a light emitting element which includes an anode electrode and a first contact part disposed between the substrate and the display element layer, the anode electrode of the third sub-pixel and a pixel circuit of the third sub-pixel being connected to each other through the first contact part in the third sub-pixel, and
wherein a plurality of first contact parts which include the first contact part in the first sub-pixel, the first contact part in the second sub-pixel and the first contact part in the third sub-pixel area are arranged along the first direction.

3. The display device of claim 2, wherein each of the first sub-pixel, the second sub-pixel, and the third sub-pixel includes an emission area in which light is emitted, and
wherein the plurality of first contact parts do not overlap with the emission area of at least one of the first sub-pixel, the second sub-pixel, and the third sub-pixel along a second direction substantially perpendicular to the first direction.

4. The display device of claim 1, wherein the pixel circuit layer further includes:
a cathode connection electrode disposed on the substrate; and
a second contact part, and
wherein the cathode connection electrode is electrically connected to the cathode electrode through the second contact part.

5. The display device of claim 1, wherein a direction in which the plurality of first contact parts are arranged is different from a direction in which the first electrode and the second electrode extend.

6. The display device of claim 1, wherein a direction in which the plurality of first contact parts are arranged corresponds to a direction in which the first sub-pixel and the second sub-pixel are arranged to be adjacent to each other.

7. The display device of claim 1, wherein the pixel circuit includes:
a first pixel circuit as a pixel circuit for the first sub-pixel; and
a second pixel circuit as a pixel circuit for the second sub-pixel, and
wherein a direction in which the plurality of first contact parts are arranged is different from a direction in which the first pixel circuit and the second pixel circuit are arranged to be adjacent to each other.

8. The display device of claim 1, wherein the pixel includes an emission area in which light is emitted, and
wherein the plurality of first contact parts are spaced apart from the emission area.

9. The display device of claim 1,
wherein the pixel includes sub-pixels disposed adjacent to each other in a second direction different from the first direction, and
wherein the plurality of first contact parts are disposed between the sub-pixels adjacent to each other.

10. The display device of claim 1, wherein the pixel circuit includes:
a first pixel circuit as a pixel circuit for the first sub-pixel; and
a second pixel circuit as a pixel circuit for the second sub-pixel, and
wherein the plurality of first contact parts overlap with the first pixel circuit and the second pixel circuit along a second direction in which the first pixel circuit and the second pixel circuit are arranged to be adjacent to each other.

11. The display device of claim 1, further comprising data lines electrically connected to the pixel circuit,
wherein a direction in which the plurality of first contact parts are arranged is different from a direction in which the data lines extend.

12. The display device of claim 1, wherein the pixel circuit layer includes:
a cathode connection electrode disposed on the substrate; and
a second contact part,
wherein the display element layer includes:
a light emitting unit including the light emitting element; and
a contact electrode layer electrically connected to at least a portion of the light emitting element,
wherein the light emitting unit includes:
a first light emitting unit including a portion of the light emitting element;
a second light emitting unit including a portion of the light emitting element;
a third light emitting unit including a portion of the light emitting element; and
a fourth light emitting unit including a portion of the light emitting element,
wherein the first contact electrode is electrically connected to one end of the light emitting element of the first light emitting unit,
wherein the second contact electrode is electrically connected to the other end of the light emitting element of the first light emitting unit, the second contact electrode being electrically connected to one end of the light emitting element of the second light emitting unit, and
wherein the contact electrode layer includes:
a third contact electrode electrically connected to the other end of the light emitting element of the second light emitting unit, the third contact electrode being electrically connected to one end of the light emitting element of the third light emitting unit;
a fourth contact electrode electrically connected to the other end of the light emitting element of the third light emitting unit, the fourth contact electrode being electrically connected to one end of the light emitting element of the fourth light emitting unit; and
a fifth contact electrode electrically connected to the other end of the light emitting element of the fourth light emitting unit, the fifth contact electrode being electrically connected to the cathode connection electrode through the second contact part.

13. The display device of claim 1, wherein the pixel further includes:
a color conversion layer configured to change a wavelength of light; and
a color filter layer configured to allow light to be selectively transmitted therethrough.

14. A display device comprising:
a pixel including a plurality of sub-pixels each including a transistor, a storage capacitor, a light emitting element, an anode electrode, and a cathode electrode,
wherein the light emitting element emits light based on an anode signal provided from the anode electrode disposed on a substrate,
wherein the anode electrode is electrically connected to an anode connection electrode disposed on the substrate through an anode contact part formed through insulating layers disposed on the substrate,
wherein anode contact parts of the plurality of sub-pixels are disposed along a predetermined direction,
wherein the anode electrode is electrically connected to a first end portion of the light emitting element, and the cathode electrode is electrically connected to a second end portion of the light emitting element,
wherein the transistor includes: a first transistor electrode, a second transistor electrode, and a gate electrode,
wherein the anode connection electrode is electrically connected to the first transistor electrode,
wherein the plurality of sub-pixels each include an alignment electrode including a first electrode and a second electrode disposed on the substrate, and a first insulating layer disposed on the first electrode and the second electrode,
wherein the anode electrode is disposed on the first insulating layer, and
wherein the cathode electrode is disposed on the first insulating layer.

15. A display device comprising:
a pixel including a plurality of sub-pixels,
wherein each of the plurality of sub-pixels includes:
a pixel circuit layer disposed on a substrate, the pixel circuit layer including an anode connection electrode and a pixel circuit; and
a display element layer disposed on the pixel circuit layer, the display element layer including a light emitting element, an anode electrode electrically connected to a first end portion of the light emitting element, and a cathode electrode electrically connected to a second end portion of the light emitting element,
wherein the anode electrode is electrically connected to the anode connection electrode through an anode contact part formed through insulating layers of the pixel circuit layer,
wherein anode contact parts of the plurality of sub-pixels are arranged along a direction while being adjacent to one side of the plurality of sub-pixels,
wherein the pixel circuit includes a transistor and a storage capacitor,
wherein the transistor includes a first transistor electrode, a second transistor electrode, and a gate electrode,
wherein the anode connection electrode is electrically connected to the first transistor electrode,
wherein the display element layer includes:
an alignment electrode including a first electrode and a second electrode disposed on the pixel circuit layer, and
a first insulating layer disposed on the first electrode and the second electrode,
wherein the anode electrode is disposed on the first insulating layer, and
wherein the cathode electrode is disposed on the first insulating layer.

16. A display device comprising:
a pixel including a first sub-pixel emitting light of a first color and a second sub-pixel emitting light of a second color,
wherein each of the first sub-pixel and the second sub-pixel includes:
a pixel circuit layer disposed on a substrate, the pixel circuit layer including a pixel circuit, and
a display element layer disposed on the pixel circuit layer, the display element layer including a light emitting element which includes an anode electrode and a cathode electrode,
wherein the pixel circuit layer includes:
a first contact part disposed between the substrate and the display element layer, the anode electrode and the pixel circuit being connected to each other through the first contact part to supply an anode signal to the light emitting element,
wherein a plurality of first contact parts which include a first contact part in the first sub-pixel and a first contact part in the second sub-pixel are arranged along a first direction,
wherein the pixel circuit layer includes:
an anode connection electrode disposed on the substrate,
a cathode connection electrode disposed on the substrate, and
a second contact part,
wherein the display element layer includes:
a light emitting unit including the light emitting element, and
a contact electrode layer electrically connected to at least a portion of the light emitting element,
wherein the light emitting unit includes:
a first light emitting unit including a portion of the light emitting element,
a second light emitting unit including a portion of the light emitting element,
a third light emitting unit including a portion of the light emitting element, and
a fourth light emitting unit including a portion of the light emitting element, and
wherein the contact electrode layer includes:
a first contact electrode electrically connected to one end of the light emitting element of the first light emitting unit, the first contact electrode being electrically connected to the anode connection electrode through one of the first contact parts,
a second contact electrode electrically connected to the other end of the light emitting element of the first light emitting unit, the second contact electrode being electrically connected to one end of the light emitting element of the second light emitting unit,
a third contact electrode electrically connected to the other end of the light emitting element of the second light emitting unit, the third contact electrode being electrically connected to one end of the light emitting element of the third light emitting unit,
a fourth contact electrode electrically connected to the other end of the light emitting element of the third light emitting unit, the fourth contact electrode being electrically connected to one end of the light emitting element of the fourth light emitting unit, and a fifth contact electrode electrically connected to the other end of the light emitting element of the fourth light emitting unit, the fifth contact electrode being electrically connected to the cathode connection electrode through the second contact part.

* * * * *